(12) United States Patent
Moeller et al.

(10) Patent No.: US 8,817,999 B2
(45) Date of Patent: *Aug. 26, 2014

(54) NETWORKED SOUND MASKING AND PAGING SYSTEM

(75) Inventors: Klaus Moeller, Oakville (CA); Niklas Moeller, Oakville (CA); Mircea Rusu, Toronto (CA); Carl Derla, Toronto (CA)

(73) Assignee: 777388 Ontario Limited, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 10/646,734

(22) Filed: Aug. 25, 2003

(65) Prior Publication Data

US 2004/0131199 A1    Jul. 8, 2004

Related U.S. Application Data

(63) Continuation-in-part of application No. 09/791,802, filed on Feb. 26, 2001, now Pat. No. 8,477,958.

(51) Int. Cl.
*H04R 3/02* (2006.01)
*H04R 27/00* (2006.01)

(52) U.S. Cl.
CPC ..................... *H04R 27/00* (2013.01)
USPC ...................................... 381/73.1

(58) Field of Classification Search
CPC .............. G10K 11/175; H04R 27/00; A61M 2021/0027
USPC .................. 381/73.1, 104–109, 107, 97–100, 381/102–103, 94.1–94.3, 71.1, 57; 700/94
See application file for complete search history.

(56) References Cited

U.S. PATENT DOCUMENTS

| | | | | |
|---|---|---|---|---|
| 3,980,827 A | * | 9/1976 | Sepmeyer et al. | 381/73.1 |
| 4,035,589 A | * | 7/1977 | Parke | 369/1 |
| 4,052,720 A | | 10/1977 | McGregor et al. | |
| 4,185,167 A | * | 1/1980 | Cunningham et al. | 381/73.1 |
| 4,319,088 A | * | 3/1982 | Orfield | 381/73.1 |
| 4,476,572 A | | 10/1984 | Horrall et al. | |
| 4,612,665 A | * | 9/1986 | Inami et al. | 381/98 |
| 4,686,693 A | * | 8/1987 | Ritter | 381/73.1 |
| 5,386,478 A | * | 1/1995 | Plunkett | 381/103 |
| 5,406,634 A | * | 4/1995 | Anderson et al. | 381/82 |
| 5,440,644 A | * | 8/1995 | Farinelli et al. | 381/81 |
| 5,675,830 A | * | 10/1997 | Satula | 710/9 |

(Continued)

OTHER PUBLICATIONS

Chinese Office Action dated Dec. 1, 2006.

*Primary Examiner* — Lun-See Lao
(74) *Attorney, Agent, or Firm* — Harness, Dickey & Pierce

(57) ABSTRACT

A sound masking system for shaping the ambient noise level in a physical environment. The sound masking system comprises a networked and distributed system having a number of master units coupled together and to a control unit. One or more of the master units may include satellite sound masking units which function to reproduce the sound masking signal generated by the master sound masking unit. Each of the master units is addressable over the network by the control unit enabling the control unit to program the contour, spectral band, and gain characteristics of the sound masking output signal. The system may also include a remote control unit which provides the capability to tune and adjust each master sound masking unit in situ without requiring physical access through the ceiling installation. According to another aspect, there is a networked paging system with individually addressable speaker units for announcing a paging signal selected from a number of paging signals.

8 Claims, 22 Drawing Sheets

(56) References Cited

U.S. PATENT DOCUMENTS

| | | |
|---|---|---|
| 5,689,229 A | 11/1997 | Chaco et al. |
| 5,887,067 A * | 3/1999 | Costa et al. ................ 381/81 |
| 6,329,908 B1 * | 12/2001 | Frecska ................ 340/384.7 |
| 6,775,355 B1 * | 8/2004 | Bingel et al. ................ 379/7 |
| 6,888,945 B2 * | 5/2005 | Horrall ................ 381/73.1 |
| 7,194,094 B2 * | 3/2007 | Horrall et al. ................ 381/73.1 |
| 2002/0072816 A1 * | 6/2002 | Shdema et al. ................ 700/94 |
| 2003/0142833 A1 * | 7/2003 | Roy et al. ................ 381/73.1 |

* cited by examiner

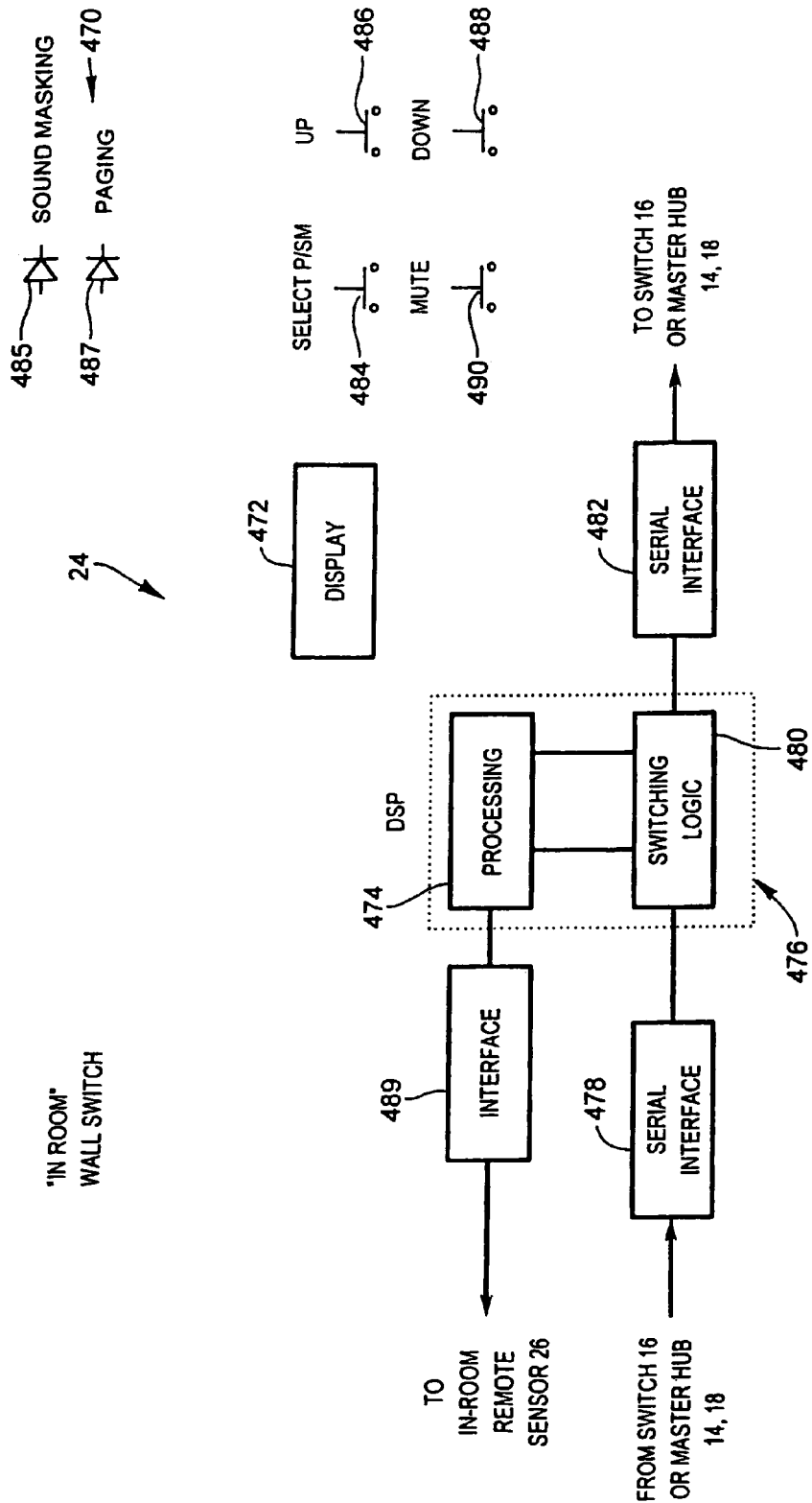

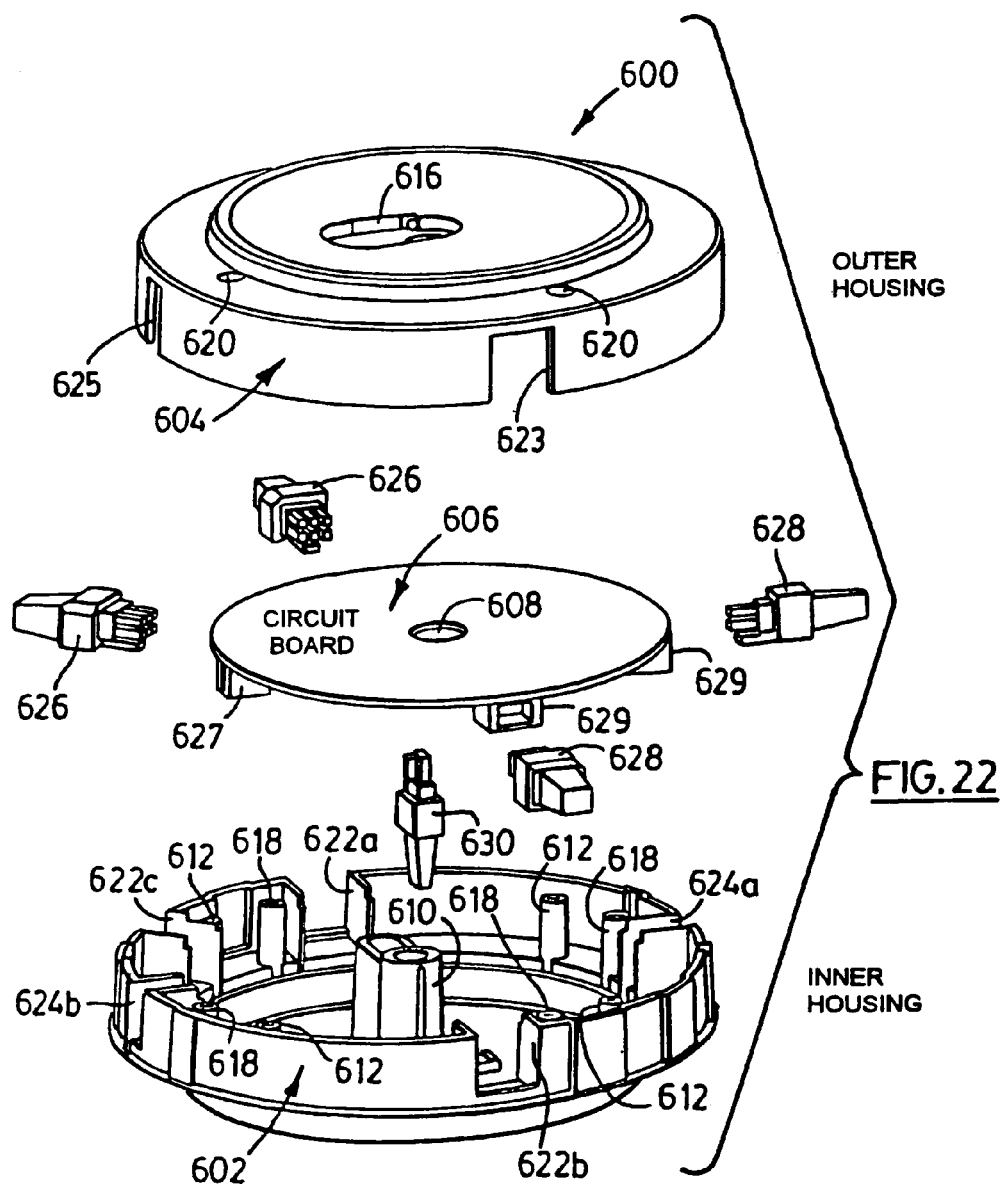

POSITION 1 (MASTER HUB - POWER / SWITCH)

. 5 CONNECTOR OPENINGS
. 3 - 6 PIN CONNECTORS
. 2 - 2 PIN CONNECTORS
. DIFFERENT CIRCUIT BOARD USED FOR POWER AND SWITCH MODELS

POSITION 2 (MASTER HUB)

. 4 CONNECTOR OPENINGS
. 2 - 6 PIN CONNECTORS
. 2 - 2 PIN CONNECTORS

POSITION 3 (SATELLITE HUB)

. 2 CONNECTOR OPENINGS
. 2 - 2 PIN CONNECTORS

NETWORKED SOUND MASKING AND PAGING SYSTEM

CROSS-REFERENCE TO RELATED APPLICATIONS

This application is a continuation-in-part of U.S. application Ser. No. 09/791,802 filed Feb. 26, 2001, which claims priority from PCT International Application No. PCT/CA02/00238 filed on Feb. 26, 2002. The entire contents of all of these applications are incorporated herein by reference.

FIELD OF THE INVENTION

The present invention relates to sound masking, and more particularly to a networked and remote controllable sound masking and paging system.

BACKGROUND OF THE INVENTION

Sound masking systems are widely used in offices and similar workplaces where an insufficient level of background sound results in diminished speech privacy. Such environments suffer from a high level of noise distractions, and lower comfort levels from an acoustic perspective. Sound masking systems operate on the principle of masking which involves generating a background sound in a given area. The background sound has the effect of limiting the ability to hear two sounds of similar sound pressure level and frequency simultaneously. By generating and distributing the background noise in the given area, the sound masking system masks or covers the propagation of other sounds in the area and thereby increases speech privacy, reduces the intrusion of unwanted noise, and improves the general acoustic comfort level in the area or space.

Sound masking systems are of two main types: centrally deployed systems and independent self-contained systems. In a centrally deployed system, a central noise generating source supplies a series of loudspeakers installed throughout the physical area or space to be covered. The independent self-contained system comprises a number of individual self-contained sound masking units which are installed in the physical space. The sound masking units operate independently of each other, but may include a number of satellite speakers which extend the range of each self-contained, i.e. master, sound masking unit. Most sound masking systems include the capability for broadcast announcements and music over the loudspeakers contained in the sound masking units.

The primary goal of sound masking systems is to provide an unobtrusive, effective masking sound that is adjustable for maximum consistency, and offers the ability to meet the requirements of the occupants. The masking output is preferably sufficient to accommodate the existing acoustic requirements of the workplace environment and adjustable to handle changes to the acoustic characteristics of environment which occur over time. Similar demands are placed on the system for the public address and music functions. In short, the preferred sound masking system would produce an output with a frequency and volume level that is controllable to produce the desired acoustic response for workplace zones ranging in size from the smallest to larger spaces.

Centralized systems are characterized by achieving uniformity of output, but not uniformity of acoustic response for the space. In a centralized system, the frequency spectrum of the sound masking output can only be adjusted at a centrally located equalizer, and as a result the sound masking output has the same frequency spectrum for all of the loudspeakers. Depending on the configuration of the centralized system, volume adjustments may be made for very large physical spaces, i.e. zones, by adjusting the amplifier output; for relatively smaller zones, volume adjustments are made by changing wiring connections or controls on the speaker enclosure, or by adjusting a hardwired zone volume control. In practice, it is difficult to accommodate environmental acoustic variations using a centralized system because the volume and frequency spectrum adjustments required for the typical physical zone size are too large to achieve a uniform acoustic result. A further disadvantage is that many of the adjustments for a centralized sound masking system require an installer or technician to re-enter the ceiling space or to rewire the speakers in the system.

The independent self-contained system has a number of important advantages over the centralized arrangement. The independent self-contained system is more effective in terms of sound generation, volume adjustment, and frequency adjustment which, in turn, improves the performance of such systems as compared to centralized systems. In particular, the independent self-contained system provides a defined non-frequency specific output range for the masking output spectrum, and adjustments can be made at each master sound masking unit. The volume controls for an independent self-contained system also provide more flexibility than in the centralized system, and provide for finer adjustments in smaller zones, in addition to centralized volume controls for large zone or global adjustment. However, with existing systems it is still necessary to re-enter the ceiling to adjust the frequency spectrum and volume output level for each master sound masking unit, and the controls for providing multi-unit volume zone adjustments require the hardwiring of the units.

While existing independent self-contained systems are more flexible than centralized systems in many regards, they do not satisfy all the requirements of an ideal sound masking system as discussed above. Furthermore, other shortcomings are associated with existing sound masking systems. In both centralized and independent self-contained systems, the public address and music volume controls are limited in the same manner as described above for sound masking output volume controls. Second, any centrally located controls only affect the output level for the speakers or sound masking units which have a hardwired connection. It will be appreciated that this severely limits the adjustability of the system to future changes unless at least some of the system is rewired. Third, the tuning procedure for existing systems is time consuming and can still be inaccurate over the system even when undertaken with the appropriate level of skill and attention. And fourthly, adjustments to existing systems must be made on-site.

Accordingly, there remains a need for a networked sound masking system with individually controllable and programmable sound masking units, and which system is easily adaptable to changing sound qualities in a physical space or spaces in a building environment. In addition, it would be advantageous, if the networked sound masking system also includes a paging function.

BRIEF SUMMARY OF THE INVENTION

The present invention provides a networked sound masking system with individually controllable and programmable sound masking units. According to another aspect, the present invention provides a networked and programmable paging system.

In a first aspect, the present invention provides a sound masking system for controlling the ambient noise level in a physical environment, the sound masking system comprises: (a) a communication network spanning at least a portion of the physical environment; (b) a plurality of sound masking units, some of the sound masking units include a sound masking component for generating a sound masking output signal and some of the sound masking units include a communication interface for coupling the sound masking units to the communication network for receiving control signals over the communication network; (c) a control unit having a communication interface for coupling to the communication network for transmitting control signals over the communication network to the sound masking units, and the control signals include signals for controlling the operation of at least some of the sound masking units.

In another aspect, the present invention provides a sound masking system for shaping the ambient noise level in a physical environment, the sound masking system comprises: (a) a communication network spanning at least a portion of the physical environment; (b) a plurality of sound masking units, some of the sound masking units include a sound masking circuit for generating a sound masking output signal for shaping the ambient noise level in the vicinity of each of the sound masking units, a programmable controller and at least one digital component for controlling operation of the sound masking circuit, and a communication interface for coupling the sound masking units to the communication network, and the programmable controller being coupled to the communication network for receiving control signals from the communication network for altering the operation of the sound masking circuit; (c) a control unit, the control unit having a communication interface for coupling the control unit to the communication network for transmitting control signals over the communication network to the sound masking units, and the control signals include signals for controlling the operation of at least some of the sound masking units; (d) wherein the sound masking circuit comprises a random noise generating component for generating an incoherent signal output, and an output amplifier for amplifying the contoured incoherent signal output, and a digital component for altering the contour of the incoherent signal output in response to control signals from the programmable controller.

In a further aspect, the present invention provides in a networked sound masking system for controlling ambient noise level in a physical environment, the networked sound masking system having a communication network for coupling a plurality of sound masking units, the sound masking units span the physical environment, the sound masking units include a sound masking component for generating a sound masking output signal and include a communication interface to the communication network for receiving control signals over the communication network, and a control unit having a communication interface for coupling the control unit to the communication network for transmitting control signals to the sound masking units, and the control signals include signals for selectively controlling the operation of the sound masking units, a computer for generating adjustment signals for the control unit for adjusting characteristics of the sound masking signal output produced by the sound masking units, the computer comprises: (a) a communication interface for transmitting the adjustment signals to the control unit, and the control unit has an external communication interface compatible with the computer communication interface; (b) an input component for receiving sound level readings for the physical environment; (c) a component responsive to the sound level readings for generating the adjustment signals associated with the characteristics of the sound masking output signal for the sound masking units.

In yet another aspect, the present invention provides a networked paging system having: (a) a communication network spanning at least a portion of the physical environment; (b) a plurality of speaker units, the speaker units include a communication interface for coupling the speaker units to the communication network, and the communication interface having an address component for recognizing control signals and a paging signal for announcement at the speaker unit intended for the speaker unit associated with the address component; (c) a control unit having a communication interface for coupling the control unit to the communication network for transmitting control signals over the communication network to the speaker units associated with the address component, and the control signals including signals for selectively controlling the operation of the speaker units; (d) the control unit includes an address generator for assigning addresses to the speaker units.

In a further aspect, the present invention provides a housing enclosure for a sound masking unit, the housing enclosure includes: (a) an inner housing component having a plurality of interior openings for receiving electrical connectors, the openings are spaced around the circumference of the inner housing component; (b) an outer housing component having a plurality of exterior openings for receiving the electrical connectors, the exterior openings being spaced around the circumference of the outer housing component; (c) the inner housing component and the outer housing component being rotatably engageable so that some of the interior openings and some of the exterior openings register to provide apertures for the electrical connectors for coupling to a circuit board located in the inner housing component; and (d) a fastener for fastening the outer housing component to the inner housing component.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Reference will now be made to the accompanying drawings, which show, by way of example, a preferred embodiment of the present invention, and in which:

FIG. 21 shows in block diagram form an "In-room" wall switch for the networked sound masking system according to the present invention;

FIG. 22 shows in diagrammatic form a configurable housing arrangement for the master sound masking or master hub units according to another aspect of the present invention.

DETAILED DESCRIPTION OF THE PREFERRED EMBODIMENT

Figure 1:
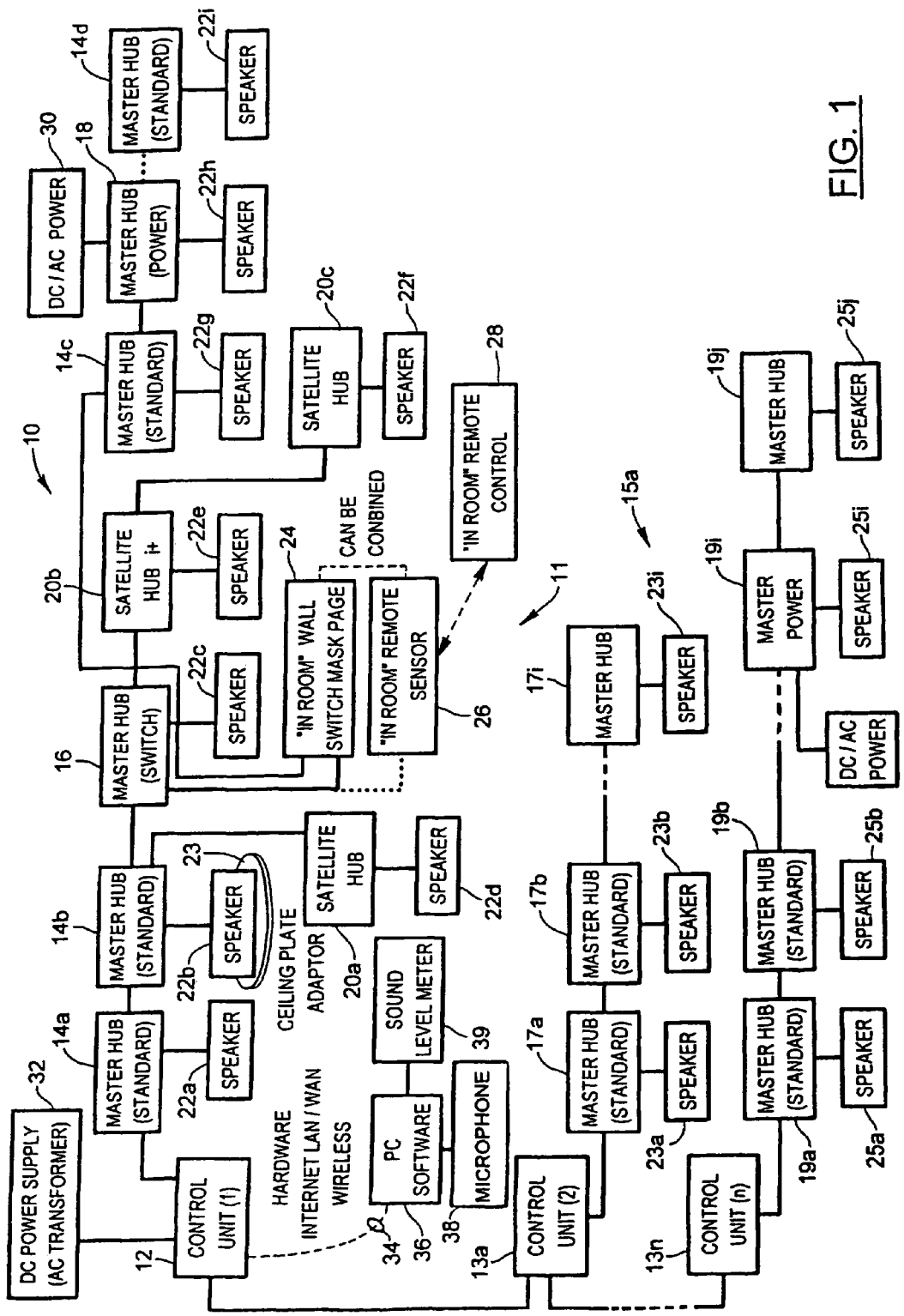
FIG. 1 shows in block diagram form a networked sound masking system according to the present invention.

Reference is first made to FIG. 1, which shows in block diagram form a networked sound masking system according to the present invention and indicated by reference 10.

As shown in FIG. 1, the networked sound masking system 10 comprises a control unit 12, and a network 11 comprising a plurality of standard master sound masking units or master hub units 14, indicated individually by 14a, 14b, 14c, ... 14n, one or more master sound masking switch units or master switch hubs 16, one or more master sound masking power units or master power hubs 18, and one or more satellite units or hubs 20, indicated individually by references 20a, 20b, 20c. The physical connections for the network 11 between the master sound masking units 14, 16, 18 may comprise 5 or 4 conductors. In a 5 conductor arrangement, two conductors carry power, two conductors provide a communication channel for control and paging signals, and one conductor provides for ground in an AC powered implementation. (In a DC implementation, the conductor for ground may be eliminated). The conductors are preferably terminated with multi-pin connectors as described below.

The master hubs 14 serve as junction boxes in the network 11. The master hub switch 16 provides a connection to an "In-room" wall switch 24 located in a physical space, e.g. a room. The In-room wall switch 24 is coupled to the network 11 through the master switch hub 16 or either directly as described below with reference to FIG. 21. As will also be described in more detail below, the In-room switch 24 allows sound masking parameters to be adjusted or set locally. The In-room switch 24 may include an integral or separate In-room remote sensor module 26 to allow the settings to be adjusted using a remote control unit 28, for example, a hand-held IR or wireless based unit. The master power hub 18 provides power for additional master hubs 14, 16 which are connected to the master power hub 18. As shown in FIG. 1, the master power hub 18 includes a power supply 30 for providing the additional power. The master hub 14d coupled to the master power hub 18 is supplied with additional power from the power supply 30.

Referring to FIG. 1, the control unit 12 also includes a power supply unit 32, for example, a DC power supply, for providing a power feed to the units coupled to the network 11. The control unit 12 may also include a communication/control link 34 to a computer 36, for example, a personal computer or PC. Through software the computer 36 provides an interface for configuring, administering, and running diagnostics. The software on the computer 36 also provides the equalization or tuning function as described in more detail below. The communication interface 34 provides the capability to access the control unit 12 from a remote location, e.g. within the building or from an offsite location. The communication interface 34 may comprise a wireless link, a telephone communication, radio communication, computer network (e.g. a Local Area Network (LAN) or a Wide Area Network (WAN)), or a connection through the Internet or World Wide Web (WWW). This provides greater flexibility in configuring, adjusting and maintaining the sound masking system 10 from a remote or off-site location, for example, a wireless link or a Wide Area Network or Internet link.

The computer 36 may be used for tuning the equalization function in the master sound masking hubs 14, 16, 18 as will be described in more detail below with reference to FIG. 14. For the tuning function, the computer 36 is equipped with appropriate software for performing the tuning functions and a microphone 38 or a sound level meter 39. The microphone 38 functions as a transducer to convert acoustical measurements into a form suitable for analysis by the software running on the computer 36. For the tuning function, the computer 36 preferably comprises a notebook computer with a wireless link for the communication link 34.

As shown in FIG. 1, speakers 22, denoted by individually by references 22a, 22b, 22c, 22d, 22e, 22f, 22g, 22h, 22i, ... plug into the master hubs 14, the switch master hubs 16, the power master hubs 18 and the satellite hubs 20. The individual speakers 22 may comprise devices which are suspended above the ceiling tiles or a speaker integrated with ceiling plate adapter 23 which is mounted in the ceiling surface. It will be appreciated that other types of speaker enclosures and installations are also contemplated. For some installations, it may be advantageous to combine the master hub 14, 16, 18 and speaker 22 in a single or integrated enclosure.

According to another aspect of the invention, additional control units, indicated individually by reference 13a to 13n, may be coupled to the control unit 12, for example, in a daisy chain. The control unit 13a is coupled to one or more master hubs 17, indicated individually by references 17a, 17b, . . . 17i, to form another network or zone 15a. As shown, a speaker 23, indicated individually by references 23a, 23b, . . . 23i is coupled to the respective master hub units 17. In addition to the master hub unit 17, the network 15 may include master switch hubs, master power hubs, and satellite hubs as described above. The control unit 13a and network 15a allow a networked sound masking system to be configured for another physical space or zone in a building, e.g. another floor, while still be connected to the control unit 12 in order to provide a centralized control facility. Similarly, the nth control unit 13n is coupled to one or more master hub units 19a, 19b, including a master power unit 19i, and/or master switch unit (not shown) and satellite hubs (not shown). As shown, a speaker 25, indicated individually by references 25a, 25b, . . . 25j, is coupled to the respective master hub units.

The master sound masking hubs 14a, master switch hubs 16 and master power hubs 18 and the satellite sound masking hubs 20 together with the speakers 22 provide the sound masking functionality, i.e. sound masking signal generation and amplification. Each master sound masking hub 14, 16, 18 (and satellite sound masking hub 20) is configured either individually or as a group for a particular physical space, e.g. office, room, zone in a open office, etc. The master sound masking hubs 14, 16, 18 are configured to generate a specific sound masking signal at a specified output level for performing the sound masking in the physical space. As will be described in more detail below, the sound masking signal is generated according to programmable spectrum, equalizer, and volume settings. The satellite sound masking units 20 are connected to their associated master unit 14 (16 or 18) and reproduce the sound masking signal generated by the master unit 14. The satellite units 20 provide a cost-effective way to expand the coverage of the master sound masking unit 14 (16 or 18) in a building space.

The control unit 12 as will be described in more detail couples to the network 11 and provides the capability to adjust the functional aspects of the master sound masking hubs 14, 16, 18 and the satellite sound masking hubs 20. The sound masking functions include masking signal spectrum, masking signal output volume, and paging volume. The control unit 12 also provides diagnostic functions and timer control functions.

The control unit 12 configures the network 11 by assigning identities or addresses to each of the master hubs 14, 16, 18. The addressing of the individual master hubs 14, 16, 18 enables the control unit 12 to direct commands and/or status requests to individual master sound masking hubs 14, 16, 18 (and indirectly the associated satellite sound masking hubs 20, i.e. via the master hubs 14, 16, 18), or to groups of master sound masking hubs 14, 16, 18, or to the entire network 11 as a whole. The control unit 12 is then used to set/adjust the masking signal spectrum, the masking signal volume, and/or the paging volume for the selected (i.e. addressed) master hub 14, 16, 18 and the satellite sound masking hub 20. According to another aspect, the master sound masking hubs 14, 16, 18 includes a digital equalizer for providing greater programming flexibility over the spectrum for the sound masking signal generated by the selected master and satellite sound masking hubs 14, 16 or 18 and 20. In the master hubs 14, 16, 18 may include another digital equalizer for the paging signal.

Figure 2:
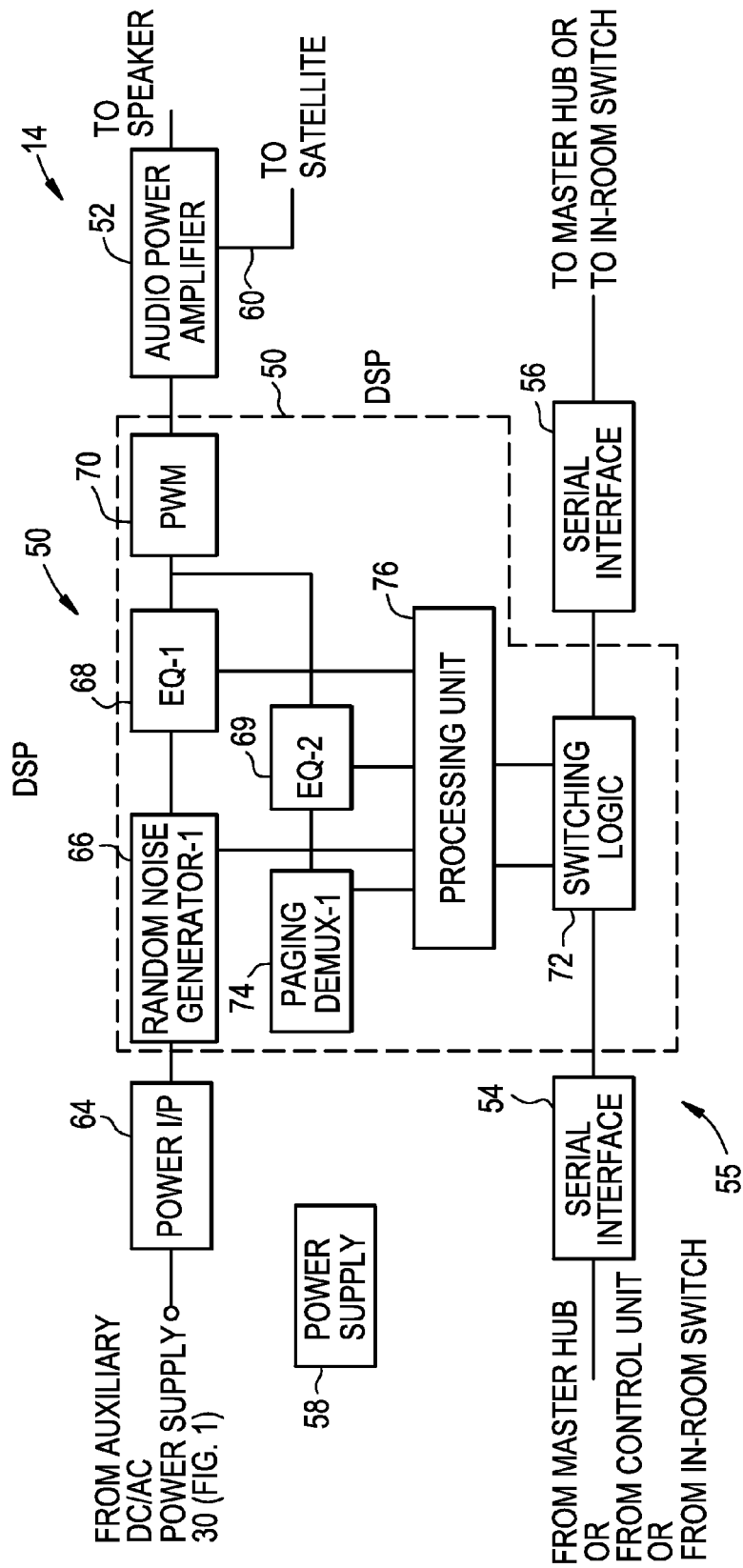
FIG. 2 shows a master sound masking unit or master hub in block diagram form for the networked sound masking system of FIG. 1.

Reference is next made to FIG. 2 which shows the master sound masking hub 14 in greater detail. As shown, the master unit 14 comprises a digital signal processing module 50, an audio power amplifier stage 52, an input serial interface 54, an output serial interface 56, and a power supply module 58. The input serial interface 54 and the output serial interface 56 form a communication interface which provides the capability to communicate with the control unit 12 and other master sound masking hubs 14, 16 or 18, and/or the In-room wall switch 24 connected in the network 11. The master hub 14 includes a local power supply 58 for powering the circuitry. The audio power amplifier stage 52 drives the speaker 22 (FIG. 1) which emits the sound masking signal or a paging signal as will be described in more detail below. The audio power amplifier stage 52 also includes an output port 60 for coupling to a satellite hub 20 (FIG. 1).

The master switch hub 16 (FIG. 1) and the master power hub 18 have essentially the same topology as the master hub 14 depicted in FIG. 2. The master switch hub 16 includes a connection for the In-room wall switch 24 for coupling to the network 11. (Alternatively, the In-room wall switch 24 is connected directly to the network 11). The master power hub 18 (FIG. 1) includes a power input 64. The power input 64 receives a power feed from the auxiliary DC/AC power supply 30 described above with reference to FIG. 1.

As shown in FIG. 2, the digital signal processing module 50 is implemented as a single chip DSP device such as the MC56F801 available from the Motorola Corporation. The digital signal processing module 50 comprises a random noise generator module 66, an equalizer module for sound masking 68, an equalizer module for paging 69, a pulse width modulator or PWM stage 70, a switching logic stage 72, and a paging demultiplexer module 74. The digital signal processing module 50 includes a processing unit 76 (i.e. a microprocessor) in addition to on-chip resources such as a memory. The processing unit 76 controls the operation of the modules 66, 68, 69, 70, 72 and 74 to provide the functionality as described in more detail below.

The random noise generator module 66 is the signal source for generating the sound masking signal. According to this aspect, the random noise generator module 66 is implemented as a firmware module executed by the processing unit 76. The equalizer 68 for the masking signal, the equalizer 69 for the paging signal, and the paging demultiplexer 74 are implemented in firmware as functions executed by the processing unit 76. The random noise generator may comprise a multi-stage shift register and an Exclusive-OR gate network operating on one register output or two register outputs as described in U.S. Pat. No. 4,914,706, which issued to the applicant in common with the subject application and is incorporated herein by reference.

The equalizer module 68 comprises a ⅓ Octave equalizer which is used for adjusting the sound spectrum of the noise signal output to the desired contour. The equalizer module 68 for the sound masking signal provides twenty-three (23) bands. In the present embodiment, the ⅓ Octave Band frequencies comprise 63, 80, 100, 125, 160, 200, 250, 315, 400, 500, 630, 800, 1000, 1250, 1600, 2000, 2500, 3150, 4000, 5000, 6300, 8000, and 10,000 Hertz (Hz). The output from the equalizer module 68 is a sound masking signal with a controllable contour which is coupled through the PWM module 70 to the amplifier power stage 52.

The PWM module 70 input to the amplifier power stage 52 functions to convert the digitally generated sound masking signal into an analog signal equivalent. It will be appreciated that in this context the output from the PWM module 70 functions under firmware control as a digital-to-analog converter or DAC.

The audio power stage 52 provides an amplified output level for the contoured sound masking signal. The contoured sound masked signal is amplified by the audio power stage 52 and output to the connected speaker 22 which emits a sound masking sound into the physical space. The audio power stage 52 also provides an amplified output for the paging signal which may comprise announcements, emergency notifications, background music or other broadcasts over the speaker. In the preferred embodiment, the output level of the audio power stage 52 is controllable by the processing unit 76 through the pulse width modulation of the input signal which is fed to the audio power stage 52.

The equalizer module 69 for the paging signal is implemented in a similar fashion but with a fewer number of bands.

Referring to FIG. 2, the switching logic stage 72 together with the input serial interface stage 54 and the output serial interface stage 56 form a communication interface, indicated by reference 55 for the master hub 14. The communication interface 55 couples the processing unit 76 in the DSP 50 to the network 11 (FIG. 1) and allows the master hub 14 to receive control commands and transmit responses. Paging signals/audio data sent by the control unit 12 over the network 11 are also received via the communication interface 55. The switching logic stage 72 connects the processing unit 76 to the input and output serial interface stages 54 and 56. The input serial interface 54 allows the processing unit 76 to communicate with an upstream device, for example, the master sound masking unit 14*a* (FIG. 1) or the control unit 12 (FIG. 1). The output serial interface stage 56 allows the processing unit 76 to communicate with a downstream device, for example, the master sound masking switch hub 16 (FIG. 1). In conjunction with the switching logic stage 72, the processing unit 76 monitors the serially encoded messages and acts upon messages which are addressed to the specified master sound masking hub 14. Each of the master sound masking hubs 14, 16 and 18 is assigned an address according to a self-addressing mechanism as will be described in more detail below.

The satellite sound masking hubs 20 (FIG. 1) are associated with respective master sound masking hubs 14, 16 or 18. The satellite sound masking hubs 20 are connected to a speaker 22, and are coupled to one of the master sound masking hubs 14, 16 or 18. The satellite sound masking hubs 20 act as slaves or satellites to the master sound masking hub 14 (16 or 18) and reproduce the sound masking signal output generated by the associated master sound masking hub 14 (16 or 18).

Figure 3:
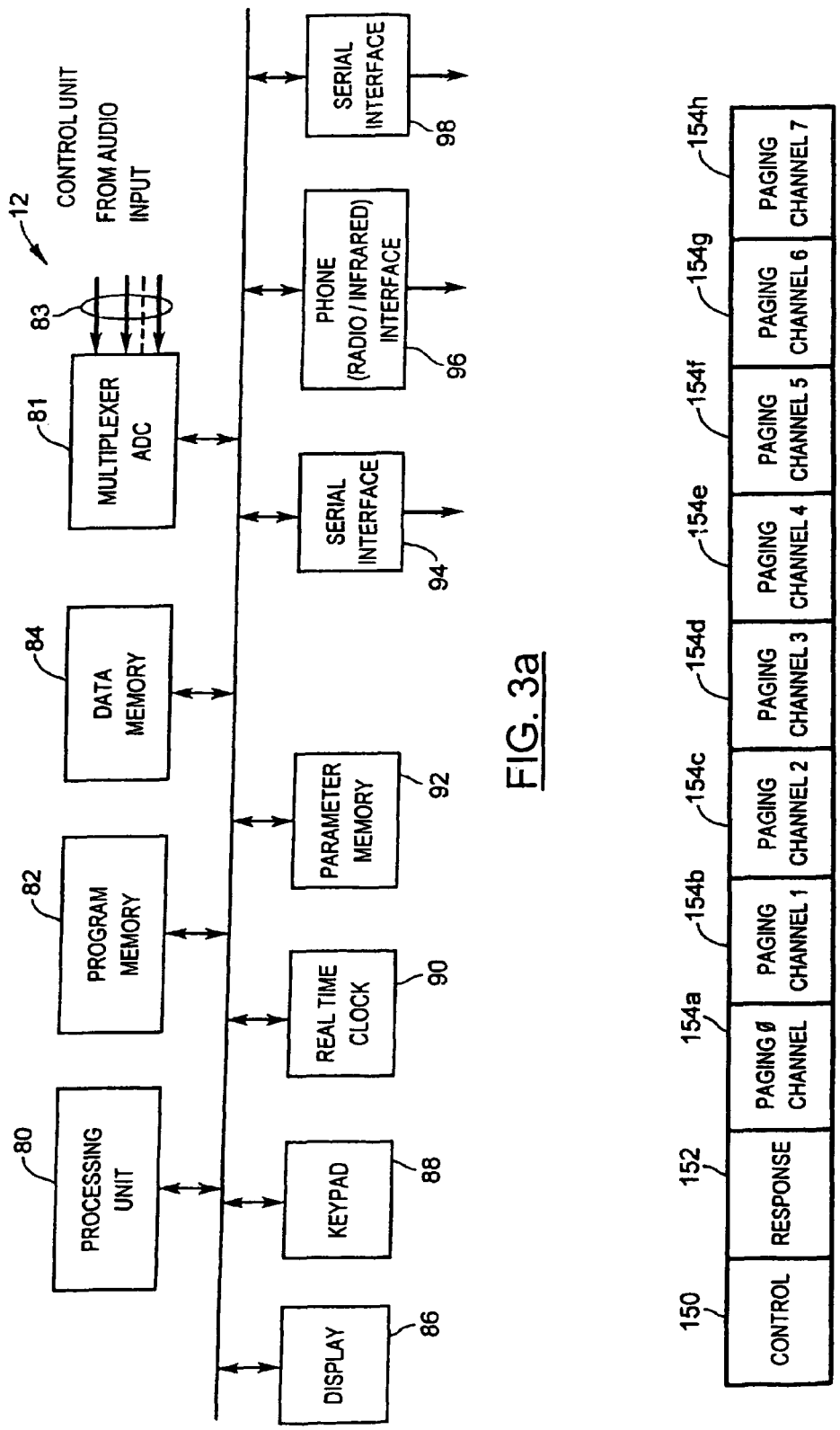
FIG. 3(a) shows in block diagram form a control unit for the networked sound masking system of FIG. 1.
FIG. 3(b) shows in diagrammatic form the control, response and paging channels for the control unit.

Reference is next made to FIG. 3(*a*), which shows the control unit 12 in more detail. As shown, the control unit 12 comprises a processor unit (i.e. a microprocessor) 80, a program memory 82, a data memory 84, a display module 86, a keypad 88, a real-time clock module 90, a parameter memory 92, a first serial communication interface 94, a communication interface 96, and a second serial communication interface 98. The first serial communication interface 94 couples the control unit 12 to the master sound masking hub 14, 16, or 18 in the network 11 (FIG. 1). The second serial communication interface 98 provides a communication interface for coupling the control unit 12 to the other control unit 12*a* (FIG. 1). The communication interface 96 provides the communication link to the computer or PC 34 as described above with reference to FIG. 1.

According to another aspect, the system 10 includes a built-in paging function. As shown in FIG. 3(*a*), the control unit 12 also includes a multiplexer having an analog-to-digital converter stage indicated by reference 81 for the paging function. The multiplexer stage 81 has a number of inputs 83 for receiving analog paging signal inputs. Under the control of the processing unit 80 one of analog paging signal inputs is selected in the multiplexer 81. The selected analog paging signal input is converted into corresponding digital signals in the analog-to-digital stage. The digitized paging signal is then inserted into one of a number of paging signal channels. As shown in FIG. 3(*b*), the communication channels for the system 10 comprise a control channel 150, a response channel 152, and eight paging signal/audio data channels 154, indicated individually by references 154*a*, 154*b*, 154*c*, 154*d*, 154*e*, 154*f*, 154*g*, and 154*h*. According to this aspect, the control unit 12 sends control signals to one or more selected master sound masking hubs 14, 16, 18 (FIG. 1) based on the address of the hubs. If required, the addressed hubs 14, 16, 18 can send a message back to the control unit 12 via the response channel 152. For the paging signals/audio data, one or more of the master hubs 14, 16, 18, i.e. belonging to a paging zone, are sent control signals indicating the paging channel 154 from which audio data is to be selected for output on the speakers associated with the selected master sound masking hubs 14, 16, 18 (FIG. 1) and any satellite sound masking hubs 20 (FIG. 1). The addressability of the master sound masking hubs 14, 16, and 18 allows paging zones to be defined which provide the capability to send different paging signals to different master hubs 14, 16, 18 and/or different groups of master hubs 14, 16, 18.

Figure 4:
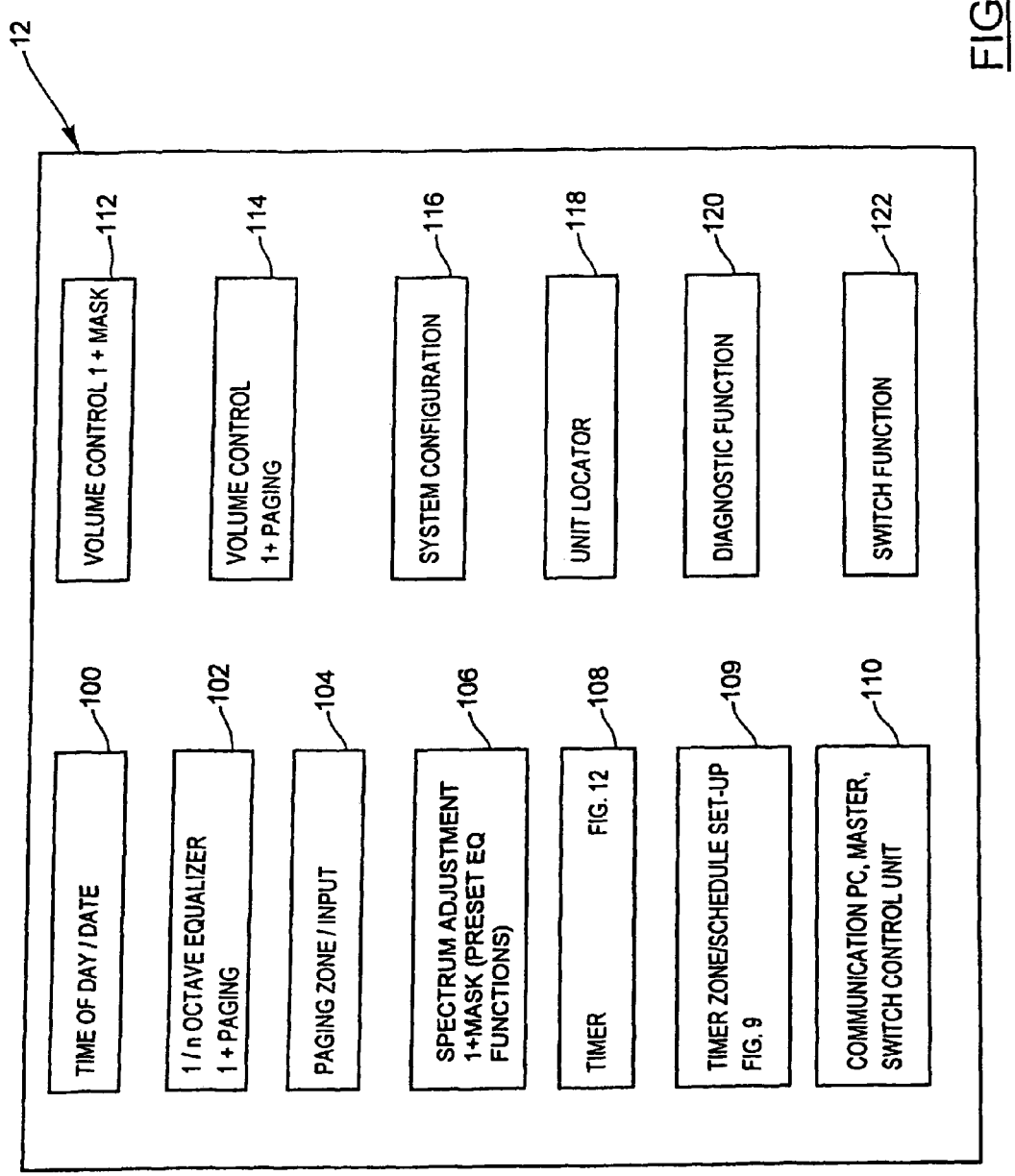
FIG. 4 shows the control unit of FIG. 3(a) in more detail, and in particular the functional modules for the control unit.

Reference is next made to FIG. 4, which shows functional modules in the control unit 12 for performing various functions associated with the networked sound masking system 10. The control unit 12 includes a functional module 100 for providing time of day and date functions, a functional module 102 to control an 1/n Octave equalizer for the paging feature, a functional module 104 for providing paging zones and selecting the paging signal for the paging zones, a functional module 106 for adjusting the frequency spectrum of the contoured sound masking signal output for one or more of the hubs 14, 16 or 18 according to preset equalization functions, a functional module 108 to provide timer functions for the system 10, a functional module 109 to provide timer zone/schedule set-up functions, a functional module 110 to control communication functions with the computer 36 (FIG. 1), the master hubs 14, 16, 18 (FIG. 1), and the In-room switch 24 (FIG. 1), a functional module 112 to provide volume control for the sound masking signal output, a functional module 114 to provide paging volume control, a functional module 116 to provide system configuration functions (including self-addressing, i.e. the addressing of the master sound masking hubs 14, 16, 18 in the network 11), a functional module 118 for locating particular hubs or units in the network, a functional module 120 for performing diagnostic functions, and a functional module 122 for processing inputs from the In-room switch 24 (FIG. 1). The operation of the functional modules in the control unit 12 is now described in more detail with reference to the flowcharts in FIGS. 5 to 19.

Figure 5:
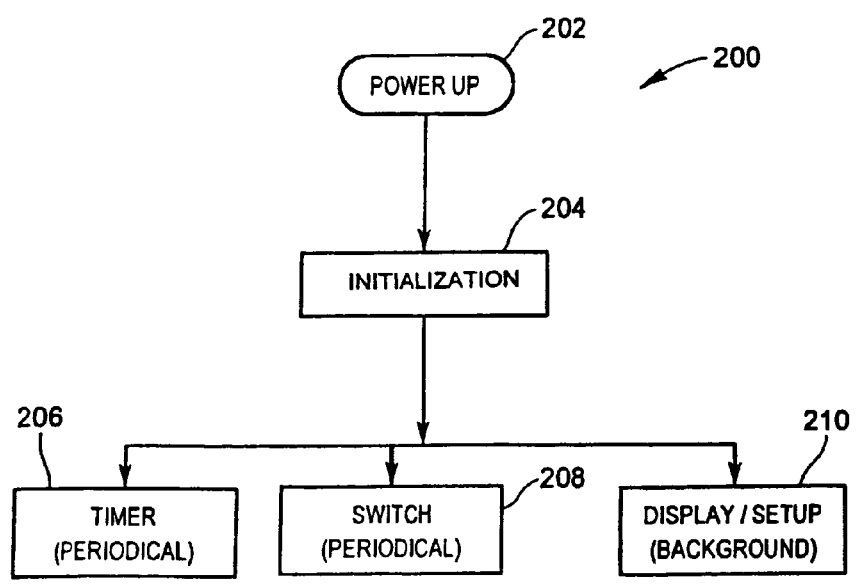
FIG. 5 shows in flowchart form a main functional processing method for the control unit of FIG. 3(a)

Reference is first made to FIG. 5, which shows a start-up process 200 for the control unit 12. The start-up process 200 is executed in response to a power-up 202 or a reset condition. The start-up process 200 comprises an initialization step 204 which includes configuring the control unit 12. After the initialization step 204, the control unit 12 runs a timer operation 206, a switch operation 208, and a display/setup operation 210. The display/setup operation 210 is executed as a background task, for example, in a polling loop. The timer operation 206 is periodically executed, for example, on an interrupt driven basis or as part of a polling loop in the display/setup operation. The switch operation 208, i.e. sensing inputs from the In-room switch 24 (FIG. 1) is also periodically executed.

Figure 6:
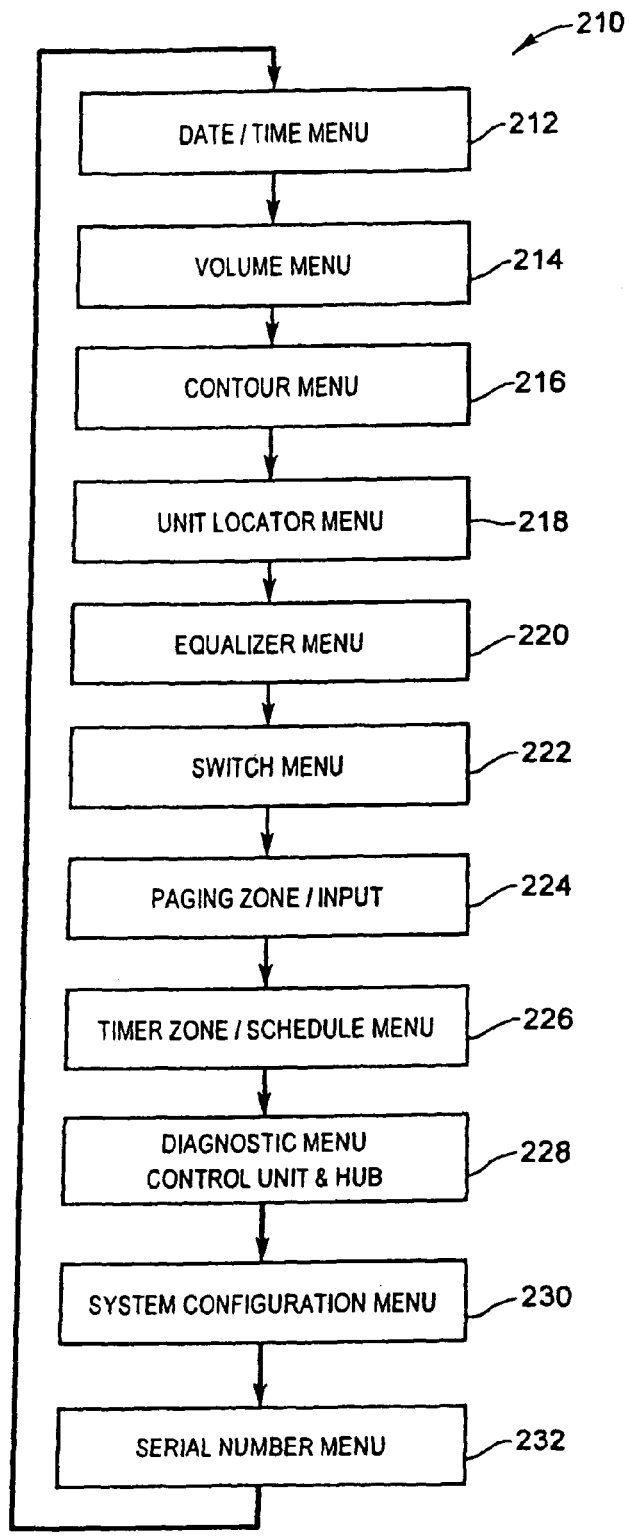
FIG. 6 shows in flowchart form the processing steps for the display/setup function in the control unit for the networked sound masking system according to the present invention.

Reference is next made to FIG. 6, which shows the display/setup operation 210 in more detail. As shown the display/setup operation 210 comprises displaying a series of menu functions on the display 86 (FIG. 3) which are accessed via selections from the keypad 88 (FIG. 3). As shown in FIG. 6, the menu functions include a Date/Time function menu 212, a Volume function menu 214, a Contour menu function 216, a Unit (i.e. hub) Locator function menu 218, an Equalizer Setting function menu 220, a Switch function menu 222, a Paging Zone/input function 224, a Timer Zone/Schedule function menu 226, a Diagnostic function menu 228, a System Configuration function menu 230, and Serial Number function menu 232. According to another aspect, the functionality of the control unit 12 may be implemented in the computer 36.

Figure 7:
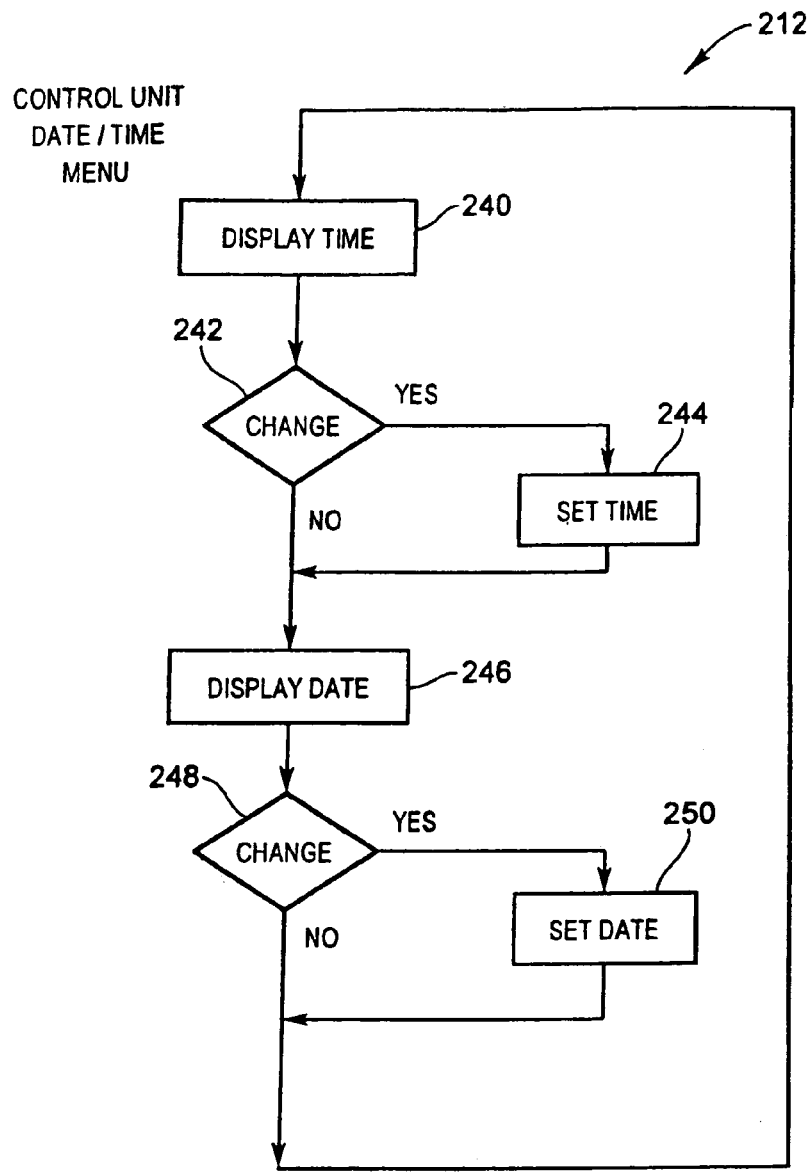
FIG. 7 shows in flowchart form the processing steps for the date/time function in the control unit for the networked sound masking system.

The processing steps for the Date/Time function menu 212 are shown in FIG. 7. The first step comprises displaying the time of day 240 and prompting the user to change the time of day 242. If the user selects to change the time of day, then a set time procedure 244 is executed. Otherwise the date is displayed 246, and the user is prompted to change the date 248. If the user selects to change the date, a set date procedure 250 is executed.

Figure 8:
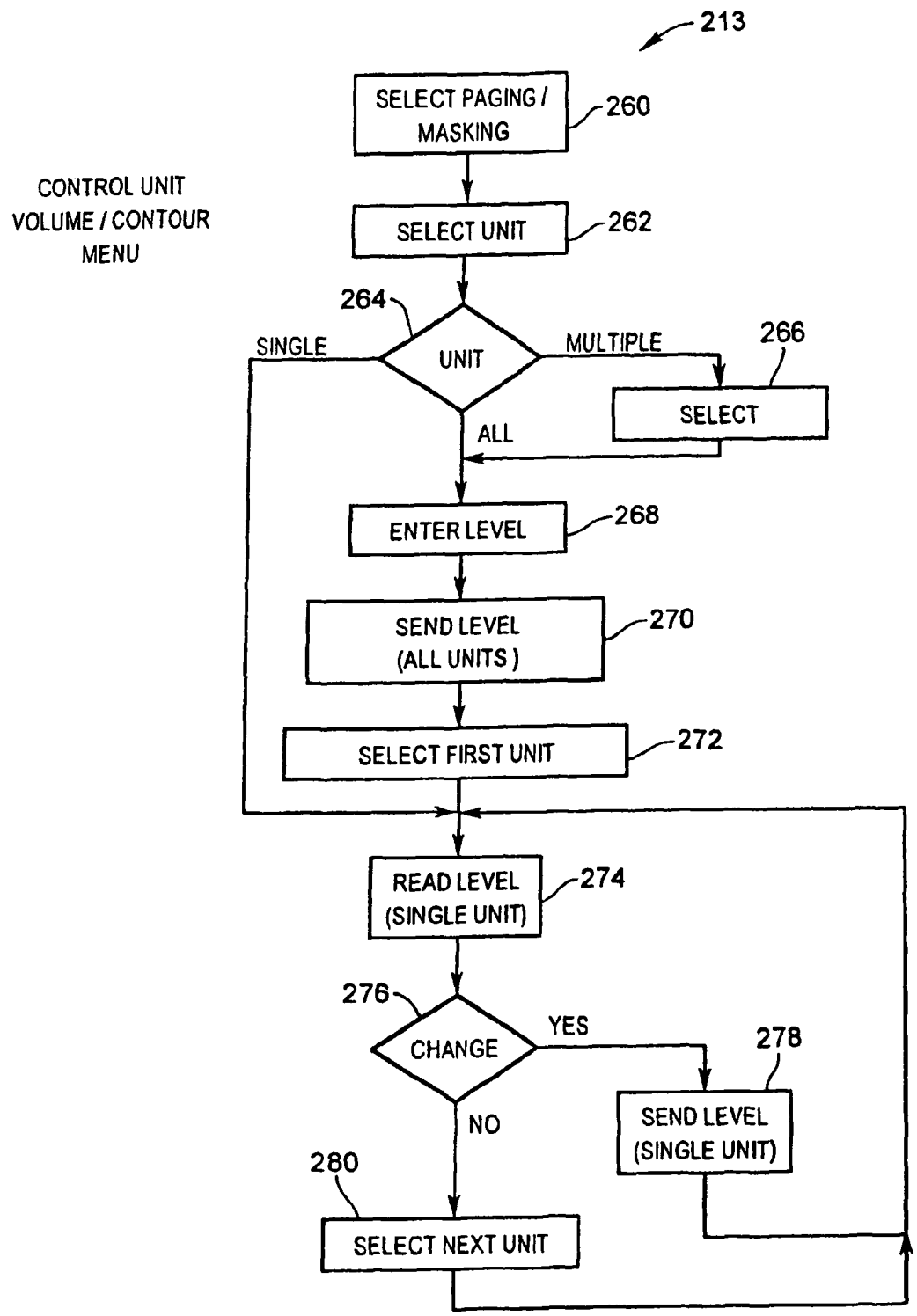
FIG. 8 shows in flowchart form the processing steps for the volume/contour/EQ (Equalizer) functions in the control unit for the networked sound masking system.

Reference is next made to FIG. 8, which shows in more detail the processing steps for setting the Masking and Paging volume function 214, the Contour Control function for the sound masking signal 216, and the Equalizer Band function 220 for the paging signal. The steps for controlling each of these functions is implemented according to a process 213 as illustrated in FIG. 8. As shown, the first step in block 260 comprises selecting the paging function or the sound masking function. The next step in block 262 comprises selecting the master sound masking hub. In decision block 264, a selection is made between a single master sound masking hub 14, 16, 18 or multiple master sound masking hubs 14, 16 and/or 18. If multiple master sound masking hubs 14, 16, 18 are to be configured, then the next step 266 involves selecting the range for the sound masking hubs 14, 16, 18. The level for the sound masking hubs 14, 16, 18 in the range is entered in block 268 and transmitted via the network 11 to all the sound masking hubs 14, 16, 18 in the selected range. After the level has been sent to the sound masking hubs 14, 16, 18 in the range, in block 270, and the first sound masking unit 14*a* in the range is selected, i.e. addressed, in block 272.

Referring still to FIG. 8, the next step in block 274 involves reading the level setting for the master sound masking hub 14, 16 or 18 which was selected in step 272 or as a result of the branch from decision block 264. The level setting received from the sound masking hub 14, 16 or 18 is compared to the desired setting stored in the control unit 12, and if a change in the level is needed as determined in decision block 276, then the desired level setting is sent to the selected master sound masking hub 14, 16 or 18 in block 278. If no change is indicated for the selected master sound masking hub 14, 16 or 18', then the next master sound masking hub 14, 16 or 18 in the network 11 is selected, i.e. addressed, in block 280 and the steps 274 and 276 are repeated. The same processing steps are utilized for setting the Masking signal and Paging signal Volume function, the Contour Control function 216, and the Equalizer Band functions for the paging signals 220.

Figure 9:
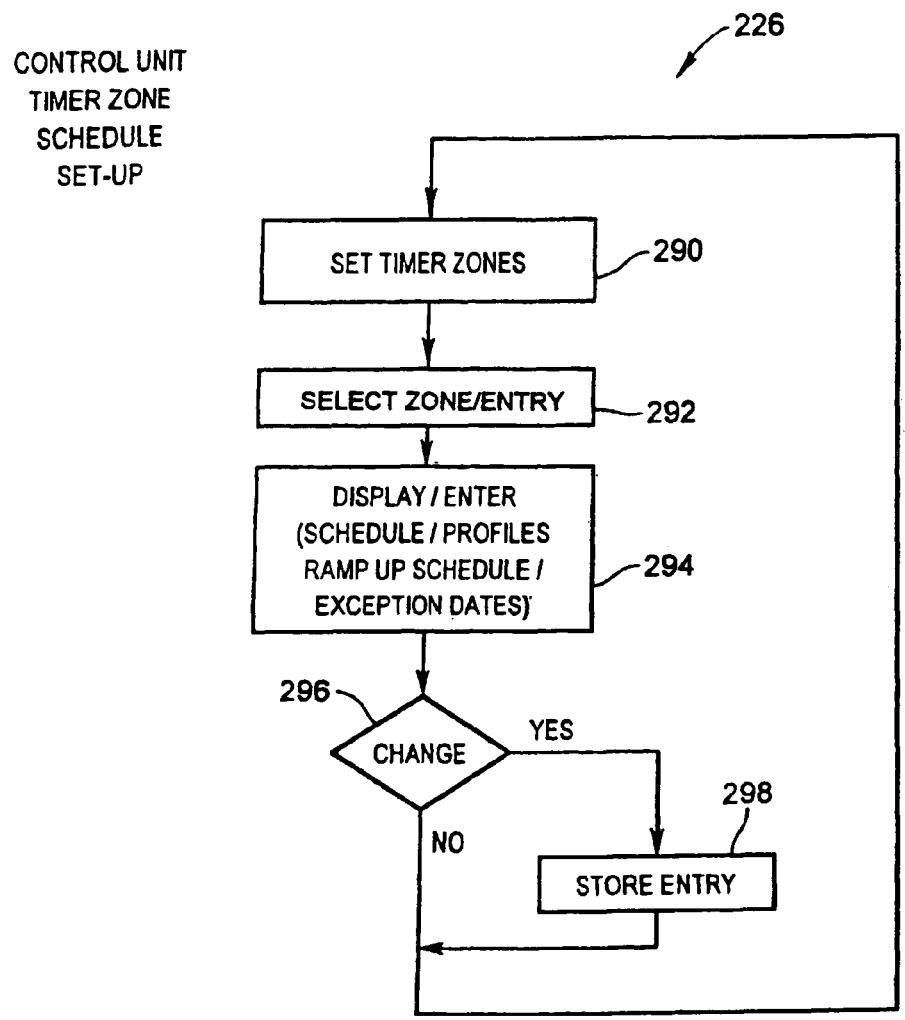
FIG. 9 shows in flowchart form the steps for setting the timer function for the control unit for the networked sound masking system.

Reference is next made to FIG. 9, which shows in more detail the processing steps for the Timer Zone/Schedule function menu 226. The first step in block 290 comprises setting timer zones in the network 11. The next step involves selecting the zone in block 292. Next in block 294, timer schedules, timer profiles, ramp-up schedules and exception dates are displayed for the selected zone, and the user is prompted to enter a change in the timer settings. If a change is entered (decision block 296), then the entry is stored in memory as indicated in block 298. The timer zones are independent from the switch and paging zones. The timer schedules may include pre-programmed profiles, such as, standard office settings, regular office hours, and executive office settings for ramp-up, timer schedules and exception dates. The ramp-up feature provides the capability to set timed schedules for ramping up the sound masking output level. Exception dates are programmed for dates such as holidays, and override the regular timer schedule.

Figure 10:
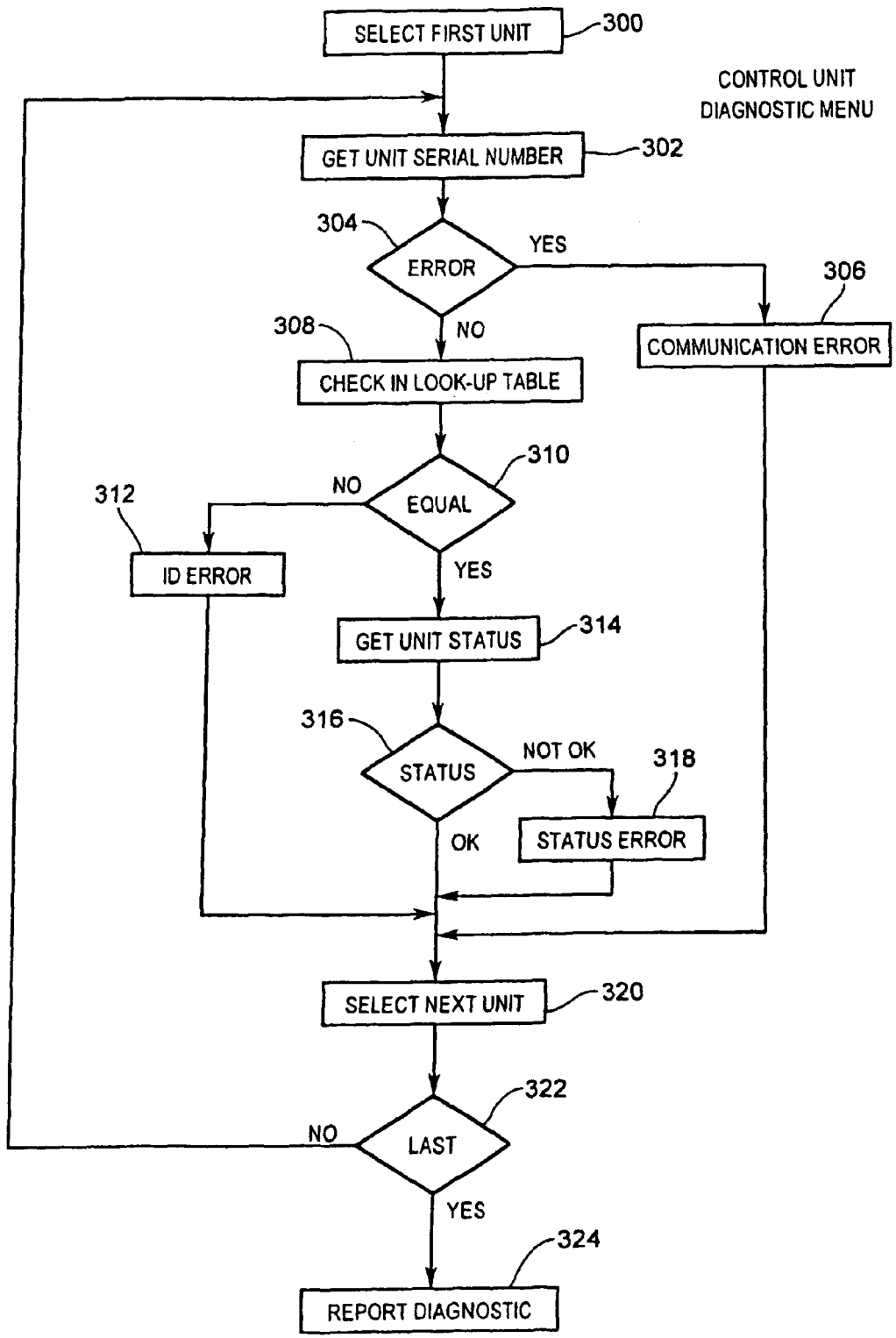
FIG. 10 shows in flowchart form the processing steps for a diagnostics function in the control unit for the networked sound masking system.

Reference is next made to FIG. 10, which shows the operation of the diagnostic menu 228 and function 120 (FIG. 4) for the control unit 12 in more detail. The first step 300 involves the control unit 12 selecting the first of the master sound masking hubs 14, 16 or 18 for the diagnostic test. In response, the control unit 12 retrieves the serial number from the master sound masking hub 14, 16, 18 over the network 11 as indicated by block 302. If there is an error (as indicated by decision block 304), then a communication error (in block 306) is logged for that hub 14, 16 or 18 and another hub 14, 16 or 18 is selected in block 320. If there is no communication error (decision block 304), then the control unit 12 checks the serial number against the entry stored in a lookup table in block 308. If the serial number does not match the entry in the lookup table, then an identification error is logged in block 312, and another master sound masking hub 14, 16 or 18 is selected in block 320. If the serial number matches the entry in the lookup table (decision block 310), then the status for the master sound masking hub 14, 16 or 18 is queried by the control unit 12 in block 314. The status of the selected master sound masking hub 14, 16 or 18 is checked in block 316, and if the status is fail or does not meet specifications, then a status error is logged in block 318. The next step in block 320 involves selecting another master sound masking hub 14, 16 or 18 and repeating steps 302 through 320, as described above, until all, or the selected group, of the master sound masking hubs 14, 16 or 18 have been queried as determined in block 322. The last step in the operation of the diagnostic function module 120 comprises generating and/or displaying a diagnostics report as indicated in block 324.

Figure 11A:
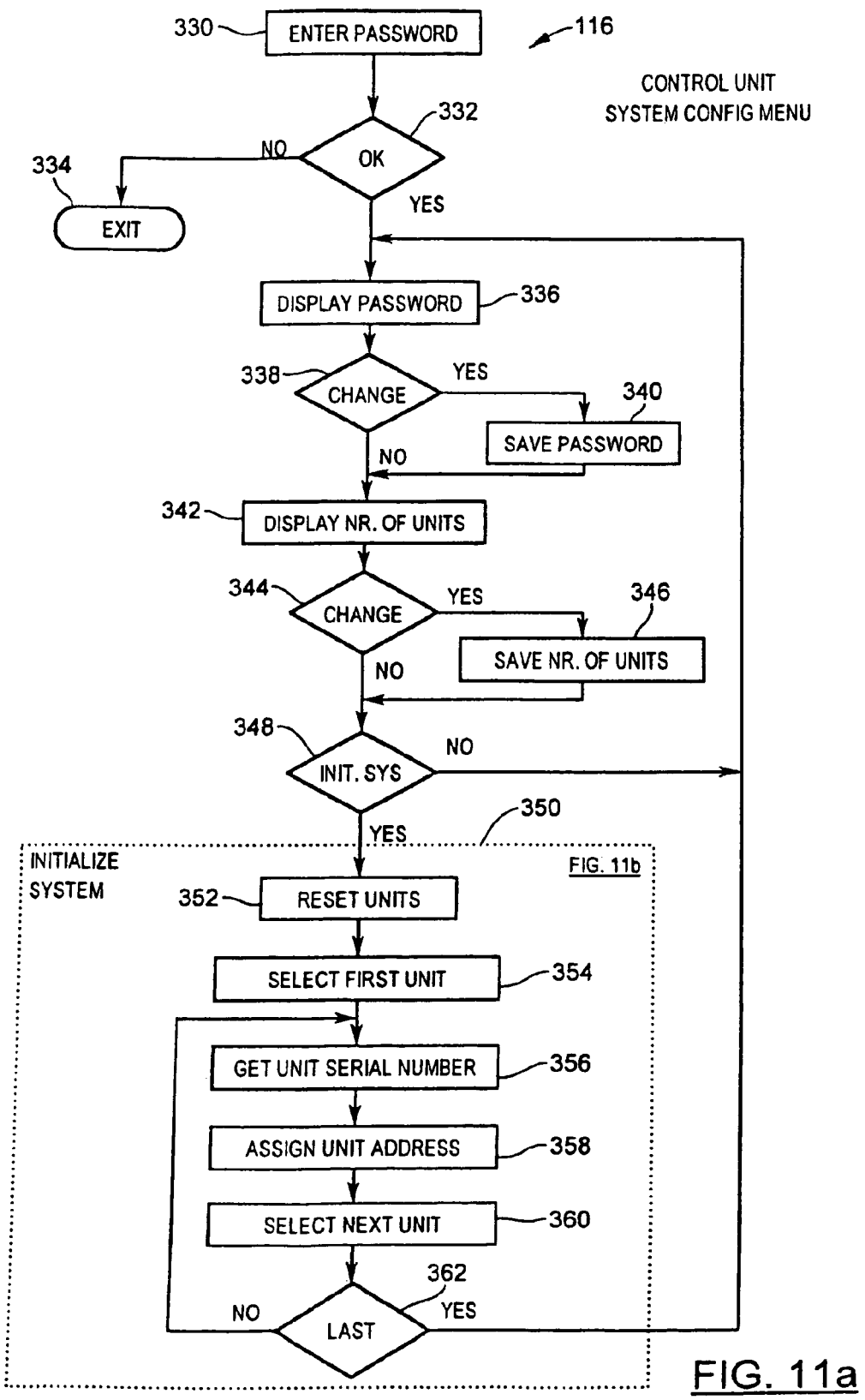
FIG. 11(a) shows in flowchart form the steps for a system configuration function in the control unit for the networked sound masking system.
Figure 11B:
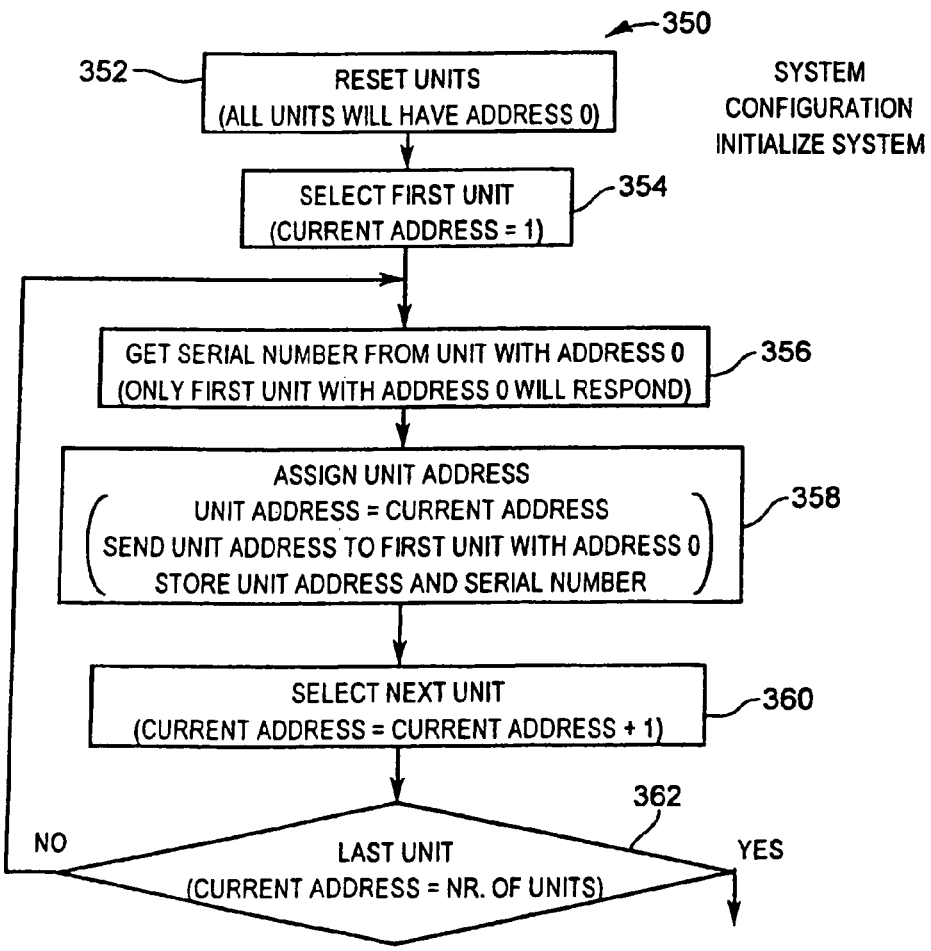
FIG. 11(b) shows in flowchart form the steps for configuring addresses for the sound masking units according to an aspect of the present invention.

Reference is next made to FIG. 11(*a*), which shows the operation of the system configuration and self addressing functional module 116 and menu function 230 for the control unit 12 in more detail. The control unit 12 is preferably password protected, and the first step 330 involves prompting the user to enter a password. If the password is incorrect (decision block 332), then further access is denied (block 334). If the entered password is correct, the password is displayed in block 336, and the user is given the option of changing the password (decision block 338). If the user changes the password, then the new password is saved in block 340. The next step 342 involves displaying the number of master sound masking hubs 14, 16, 18 that are presently configured for the network 11. If the system 10 is being setup for the first time, the number of hubs or units may be configured at the factory or entered in the field by the technician. The user is given the option of changing the number of hubs 14, 16, 18 configured for the system 10 in decision block 344, and the new number of hubs 14, 16, 18 is stored in step 346.

Referring still to FIG. 11(*a*), in decision block 348, the user is prompted to initialize the system 10. If the user elects to initialize the system 10, then the control unit 12 executes an initialization procedure indicated generally by reference 350. The initialization procedure 350 is shown in more detail in FIG. 11(*b*). As shown, the first step 352 in the initialization procedure 350 involves resetting all of the master sound masking hubs 14, 16, 18 connected to the network 11. As a result of the reset operation 352, each of the master sound masking hubs 14, 16, 18 has a logical address of 0. Since all of the hubs 14, 16, 18 have logical address 0, the first sound masking hub 14, 16 or 18, i.e. the master hub 14a, responds when the control unit 12 queries the hubs 14, 16, 18 as indicated by block 354. The selected hub 14, 16, 18 is then queried for its serial number in block 356. The serial number is assigned to the hub 14, 16, 18 at the time of manufacture and preferably comprises a code stored in non-volatile memory in the hub 14, 16, 18. The control unit 12 uses the serial number to generate a unit address, i.e. logical address, for the hub 14, 16, 18 as indicated in block 358. The serial number is preferably stored in memory, for example a lookup table in the control unit 12, and provides a cross-reference to the master sound masking hub 14, 16, 18. The current logical address generated in step 358 is unique for the master hub 14, 16, 18 in the present network configuration 10, but for another network configuration the logical addresses may be regenerated. Following the addressing operation, the next sound masking hub 14 is selected by the control unit 12 and the current logical address is incremented for the next sound masking hub 14, 16, or 18. The operations for assigning the current logical address to the master sound masking hub 14, 16, 18 based on the serial number according to steps 356 to 360 are repeated. These operations are repeated until all of the sound masking hubs 14, 16, 18 have been assigned current logical addresses by the control unit 12 as indicated by decision block 362. Following this scheme, the current logical address for the last sound masking hub 14, 16, 18 is equal to the number of sound masking hubs 14, 16, 18 connected to the networked system 10.

Figure 12:
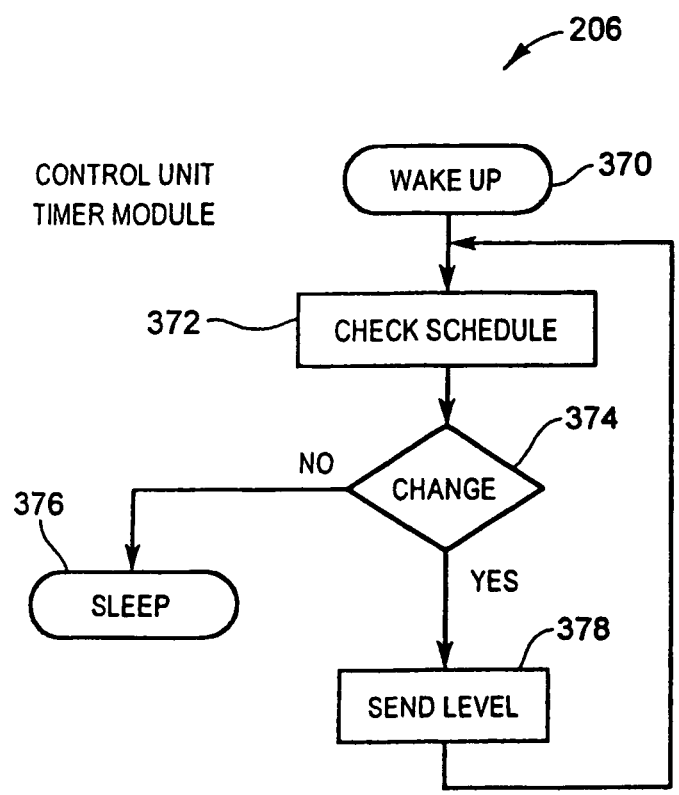
FIG. 12 shows in flowchart form the processing steps for the timer function for the control unit.

Reference is next made to FIG. 12, which shows the timer function 206 (FIG. 5) in more detail. In response to an interrupt or a request from a polling loop, a wake-up call or "clock tick" is periodically issued as indicated in step 370, and a schedule of timed events is checked in block 372. The timed events may comprise, for example, changes in the level of the sound masking signal for all or some of the master sound masking hubs 14, 16, 18 (and the associated satellite sound masking hubs 20). If the schedule indicates that there is no change in sound masking level, then the timer function 206 goes to sleep (block 376). If there is a scheduled change, then the new level for the sound masking signal is transmitted via the network 11 to the affected sound masking hubs 14, 16, 18 (block 378).

Figure 13:
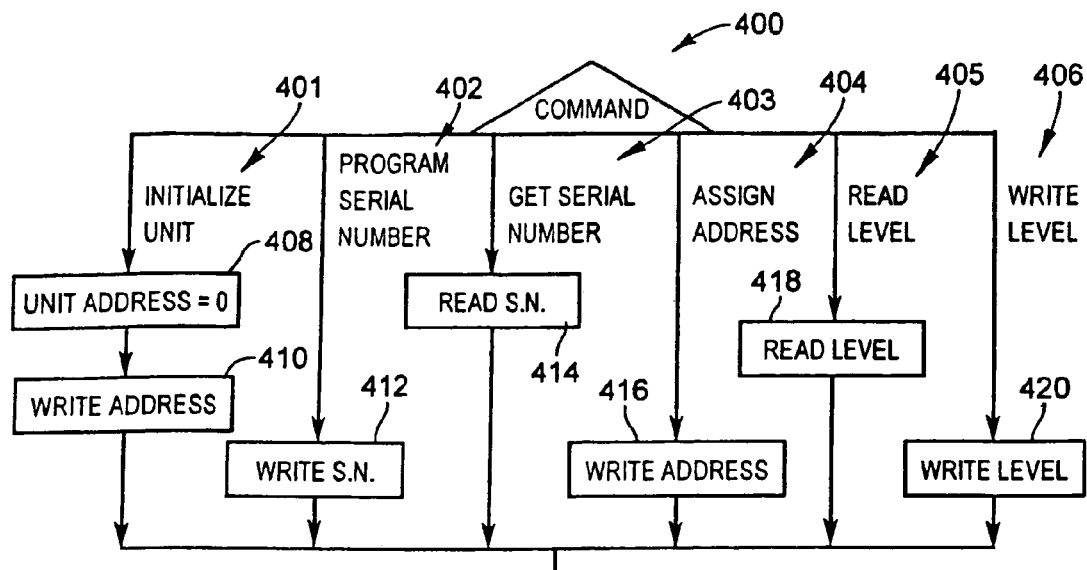
FIG. 13 shows in flowchart form a functional processing method for selecting control functions in the master sound masking or master hub units.

Reference is next made to FIG. 13, which shows in flowchart form a method for selecting control functions in the control unit 12 for controlling the master sound masking units 14. As shown, the control functions 400 include an initialization procedure 401, a program serial number procedure 402, a read serial number procedure 403, an assign logical address procedure 404, a read level procedure 405, and a write level procedure 406.

The initialization procedure 401 comprises a function 408 for resetting the logical addresses and a function 410 for writing logical addresses for the master sound masking hubs 14, 16, 18 as described above with reference to FIG. 11. The program serial number procedure 402 provides a mechanism for programming or regenerating the serial number stored in non-volatile memory for each hub 14, 16, 18. The procedure 402 comprises a write serial number function 412. The read serial number procedure 403 comprises a read serial number function 414 which the control unit 12 utilizes to read the serial numbers of the hubs 14, 16, 18, for example, as described above with reference to FIG. 11. The assign logical address procedure 404 comprises a write address function 416 for writing, i.e. assigning, logical addresses to the sound masking hubs 14, 16, 18. The read level procedure 405 comprises a read level function 418 which allows the control unit 12 to read the current levels for the various settings for the hubs 14, 16, 18 being addressed by the control unit 12 or by an In-room switch. The write level procedure 406 comprises a write level function 420 which allows the control unit 12 to write the level for the selected function for the sound masking signal in the master sound masking hub 14, 16, 18 being addressed by the control unit 12. Once the master sound masking hub 14, 16, 18 is selected, the control unit 12 next selects the function to be queried/programmed, and then reads the parameter setting using the read level function 418, or writes the parameter setting, using the write level function 420.

As described above, the master sound masking hubs 14, 16, 18 according to the present invention include an equalizer stage 68 (FIG. 2) which allows the shaping of the sound spectrum of the sound masking noise signal output. In addition, the hubs 14, 16, 18 also includes the second equalizer stage 69 (FIG. 2) to allow for shaping the spectral characteristics of the paging signal. Advantageously, the capability to address each of the sound masking hubs allows the equalizer stages 68, 69 to be individually set for each of the hubs 14, 16, 18 or a group of the hubs 14, 16, 18, and this capability greatly enhances the functionality of the networked sound masking system 10 according to the present invention.

Figure 14:
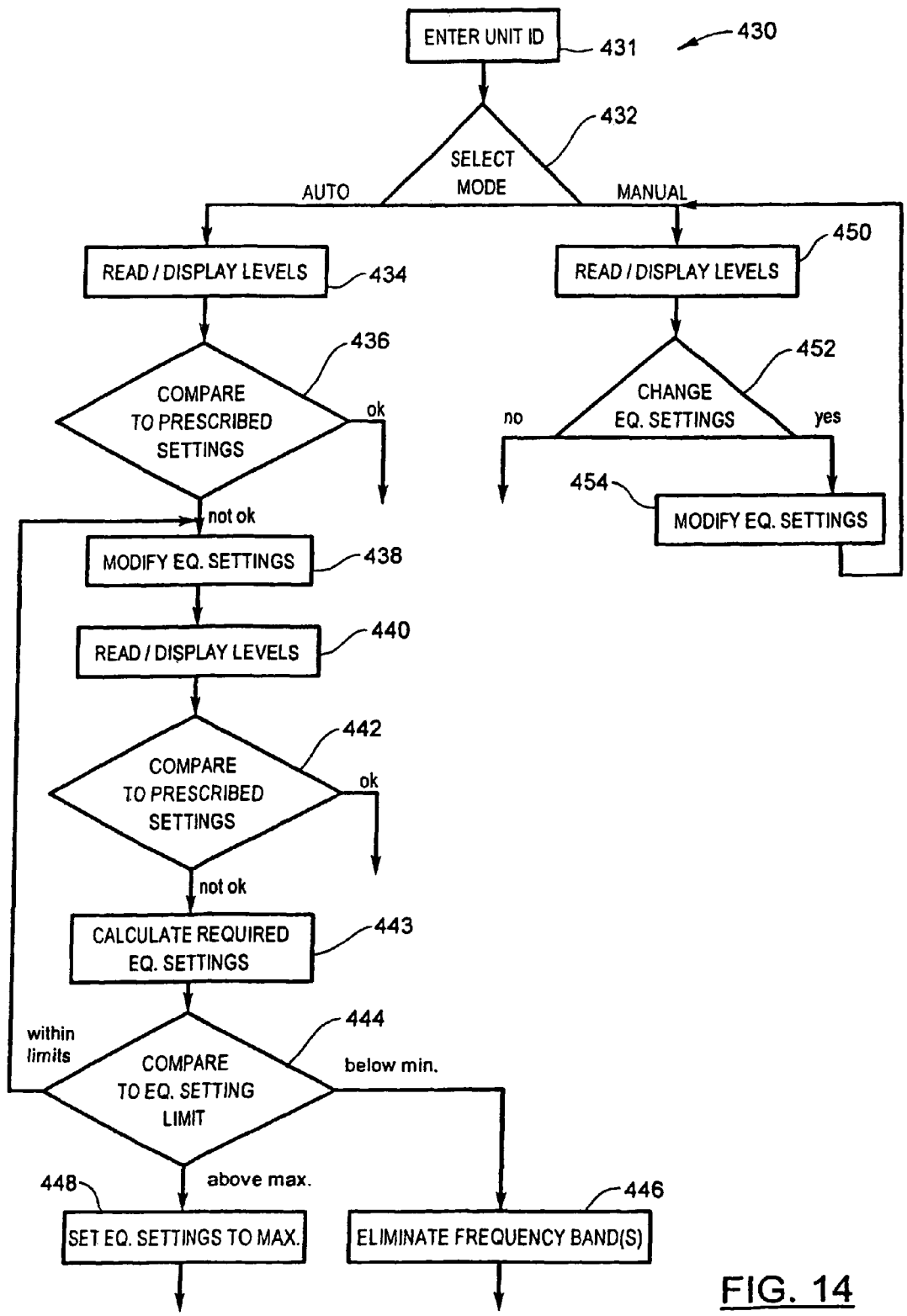
FIG. 14 shows in flowchart form the processing steps for an equalization in the networked sound masking system according to the present invention.

Reference is made to FIG. 14 which shows a procedure 430 according to another aspect of the invention for controlling the equalizer function in each of the sound masking hubs 14, 16, 18. According to this aspect, the equalizer functions are performed in the computer 36. The computer 36 and the microphone 38 are used to take sound level readings for the physical space. Calculated control settings based on these readings are transmitted by the computer 36 via the communication link 34, e.g. wireless link, to the control unit 12, which then transmits control data to the hubs 14, 16, 18 affected. As will now be described with reference to FIG. 14, the readings from the microphone 38 or the sound level meter 39 are used in conjunction with settings in a Prescribed Contour Table stored in the computer 36 to adjust the level settings in the equalizer stages 68 for the master sound masking hubs 14, 16, 18. It will be appreciated that the Prescribed Contour Table defines the ideal sound masking levels for the physical space, and the levels are programmable or user-definable.

As shown in FIG. 14, the first operation in the equalization procedure 430 comprises receiving the unit ID(s) (entered by a user or technician) to select the sound masking hub or hubs 14, 16, 18 on which the equalizer function is to be adjusted/programmed (block 431). The next step in block 432 involves selecting the equalization adjustment or tuning mode. If auto tuning mode is selected, then the next step in block 434 involves reading (and displaying) the current sound levels. Next in block 436, the sound levels are compared to prescribed settings stored in memory. The prescribed levels are user definable and may be determined, for example, by identifying acceptable sound level readings in decibels (dB) by band, with one band for every 1/n octave in the equalizer. A prescribed setting may comprise, for example, a 63 Hz band center at 46 dB+/−2 dB. If the measured sound levels are within an acceptable range of the prescribed settings, then the auto-tuning procedure is concluded. If not within an acceptable range, then the equalization levels are modified by the computer 36 and applied to the relevant sound masking hubs 14, 16, 18 via the control unit 12, as indicated in block 438. Measurements for the modified levels set in block 438 are then taken as indicated in block 440, and these measurements are again compared to the prescribed settings as indicated in block 442. If the modified levels are within an acceptable range, then the auto-tuning procedure is concluded. If the measurements corresponding to the modified levels are not within the acceptable range as determined in block 442, then the required equalizer settings are calculated in block 443 and they are compared to the equalizer setting limits in block 444. The setting limits define maximum or minimum equalization settings, for example, zero (0) as the minimum and one hundred (100) as the maximum. As indicated, a comparison is made to determine if the required equalizer settings are "below minimum", "above maximum", or "within limits". If the required equalizer settings are within limits, then steps 438 to 442 are repeated. If the required equalizer settings are below minimum, then the frequency band(s) corresponding to those levels are eliminated. If the required equalizer settings are above maximum, then the equalizer settings are set to maximum in block 448.

Referring again to FIG. 14, in manual mode, the first step in block 450 involves taking sound level measurement and displaying the levels associated with those measurements. Next a decision is made to change the equalizer settings or to keep them the same in block 452, and if necessary the equalizer settings are changed in block 454. The process may then be repeated in step 450.

As described above, the computer 36 and the microphone 38 or the sound level meter 39 provide an effective mechanism for adjusting the equalizer function in each of the sound masking hubs 14, 16, 18 through the control unit 12 and networked connection without the need for opening the ceiling tile to physically access any of the master sound masking units 14, 16, 18.

As shown in FIG. 1, the In-room wall switch 24 is provided in a physical space, e.g. meeting room, and is connected to the master switch hub 16 or alternatively the In-room wall switch 24 is coupled directly to the network 11. The In-room wall switch 24 provides the capability for an occupant to manually adjust the output characteristics of the master hubs 14, 16 or 18 (and the associated speakers 22) configured to be associated with the In-room wall switch 24. The In-room wall switch 24 may include the In-room remote sensor 26 for use with the In-room remote control 28, for example, a handheld wireless IR device. The In-room wall switch 24 may be implemented as depicted in FIG. 21.

As shown in FIG. 21, the In-room wall switch 24 comprises a switch panel 470, a display 472, a processing unit 474, and a communication interface 476. The communication interface 476 couples the In-room wall switch 24 to the master sound masking switch hub 16 or directly to the network 11. The communication interface 476 comprises a first serial interface module 478, a switching logic stage 480, and a second serial interface module 482. The processing unit 474 uses the switching logic stage 480 to send control messages and receive display messages from the master switch hub 16 or the control unit 12 via the network 11. The processing unit 474 uses the display 472 to display status and operating information, typically received from the control unit 12. As shown, the switch panel 470 comprises a paging/sound masking function select button 484, an adjust up button 486, an adjust down button 488, and a mute button 490. Depressing the paging/sound masking button 484 to select the sound masking adjust function causes a sound masking LED 485 to be activated, and depressing the up button 486 increases the output level of the contoured sound masking output signal, while depressing the down button 488 decreases the output level of the output signal. If the paging function is selected using the button 484, a paging LED 487 is activated, and depressing the up 486 and the down 488 buttons increases or decreases the volume level of the paging signal. The mute button 490 allows the selected signal output, i.e. sound masking or paging, to be muted.

According to another aspect, the In-room wall switch 24 may be provided with an interface 489 for receiving control signals from the In-room remote sensor 26 and the wireless remote 28. The wireless remote 28 provides the functionality of the switch panel 470, i.e. sound masking/paging select, up and down adjust, mute, in a portable handheld unit.

Figure 15:
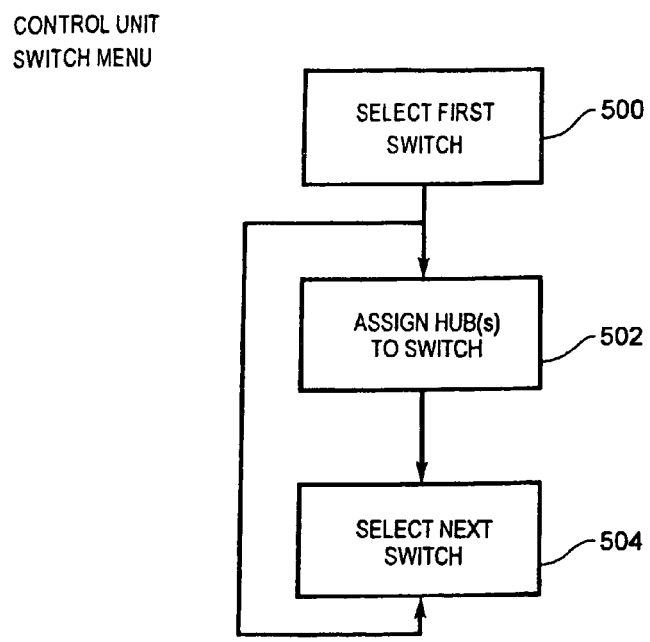
FIG. 15 shows in flowchart form the processing steps for the switch menu setting functions in the control unit for the networked sound masking system according to the present invention.

Reference is next made to FIG. 15, which shows the operation of the switching function module 122 and the switch menu 22 for the control unit 12. The first step 500 as shown in FIG. 15 comprises selecting the first In-room switch 26. The next step 502 involves assigning one or more of the master hubs 14, 16 or 18 to the selected switch 24. The process is repeated for the next In-room switch 26 as indicated in block 504.

Figure 16:
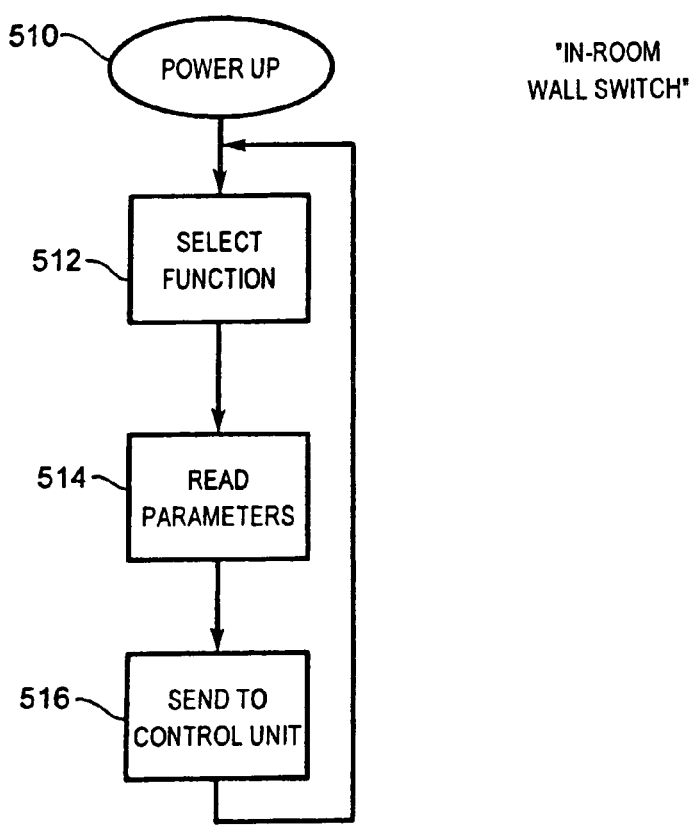
FIG. 16 shows in flowchart form a main functional processing method for an "In room" wall switch according to another aspect of the present invention.

Reference is next made to FIG. 16, which shows the primary operations performed by the processing unit 474 in the In-room wall switch 24 (FIG. 21). After power-up (block 510), the processing unit 474 scans the select button 484 to determine if the sound masking or paging function has been selected in block 512. Next in block 514, the parameters associated with the selected function are read, and then sent to the control unit 12 (i.e. via the response channel 152 (FIG. 3(*b*)). The control unit 12 then executes the change for the hubs 14, 16, 18 or 20 associated with that In-room switch 24.

Figure 17:
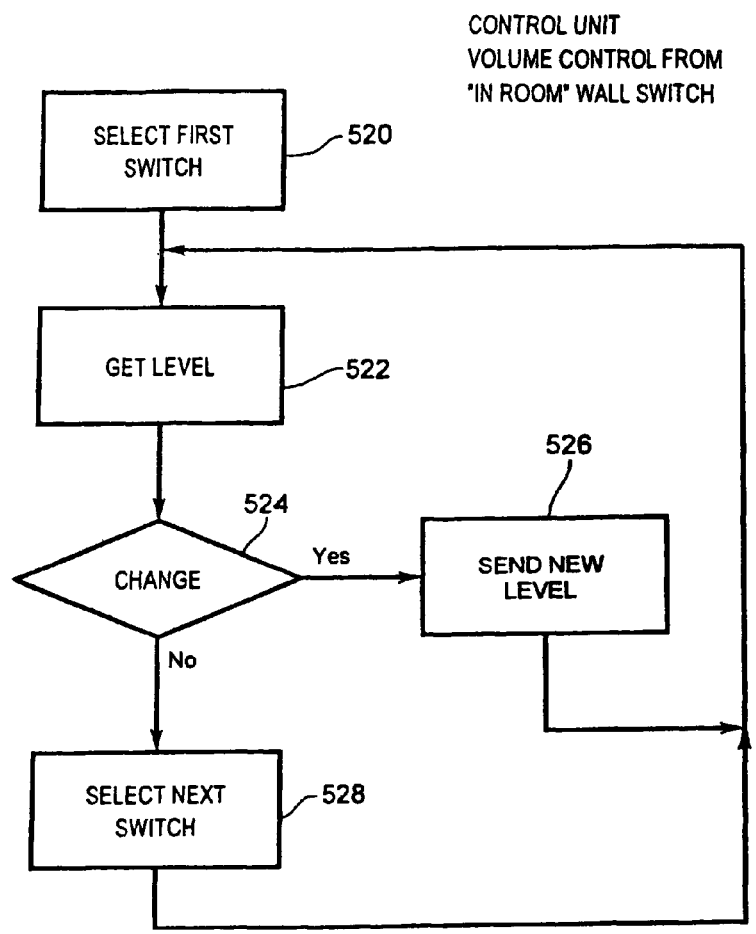
FIG. 17 shows in flowchart form the processing steps for volume menu setting functions in the control unit for the operation of the "in room" wall switch.

Reference is next made to FIG. 17 which shows the processing steps executed by the control unit 12 for the operation of the volume setting inputs from the In-room wall switch 26. The first step performed by the control unit 12 in block 520 involves selecting the first In-room wall switch 26 via the master switch hub 16 which is coupled to the In-room switch 26 through the communication interface 476 (FIG. 21). Once the In-room switch 26 is selected, the control unit 12 determines the sound masking signal output level (and the paging output volume level) from values stored in memory (block 522). Next the control unit 12 determines if there is a change in the sound masking (or paging output) volume level in block 524. As described above with reference to FIG. 21, a change in volume level is initiated by selecting the sound masking function or the paging volume function, and then depressing continuously or repeatedly the up or down button. In response, the control unit 12 sends a control message to the master sound masking hubs 14, 16, 18 programmed or associated with the In-room wall switch 24. The control message corresponds to the level setting as determined from the In-room wall switch 24. If no change is indicated for the In-room wall switch 24 in block 534, then the next In-room wall switch 24 in the network 11 is selected and the processing steps are repeated as described above.

Figure 18:
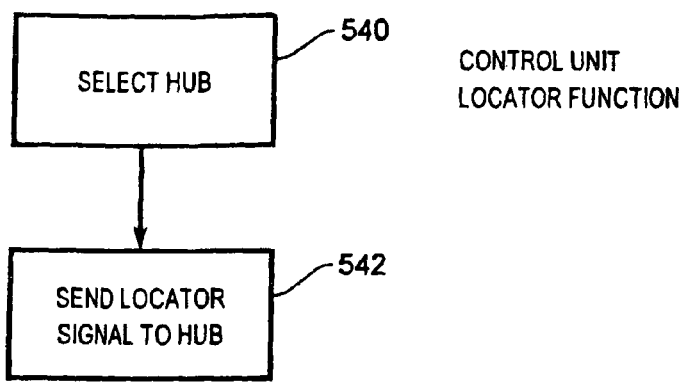
FIG. 18 shows in flowchart form the processing steps for a unit locator function in the control unit.

Reference is next made to FIG. 18 the processing steps for the unit locator function 118 (FIG. 4) and the locator menu function 218 (FIG. 6) in the control unit 12. The first step indicated in block 540 involves selecting the master sound masking hub 14, 16 or 18 in the network 11. Once selected, the control unit 12 sends a locator message or signal to the selected hub 14, 16 or 18 in step 542.

Figure 19:
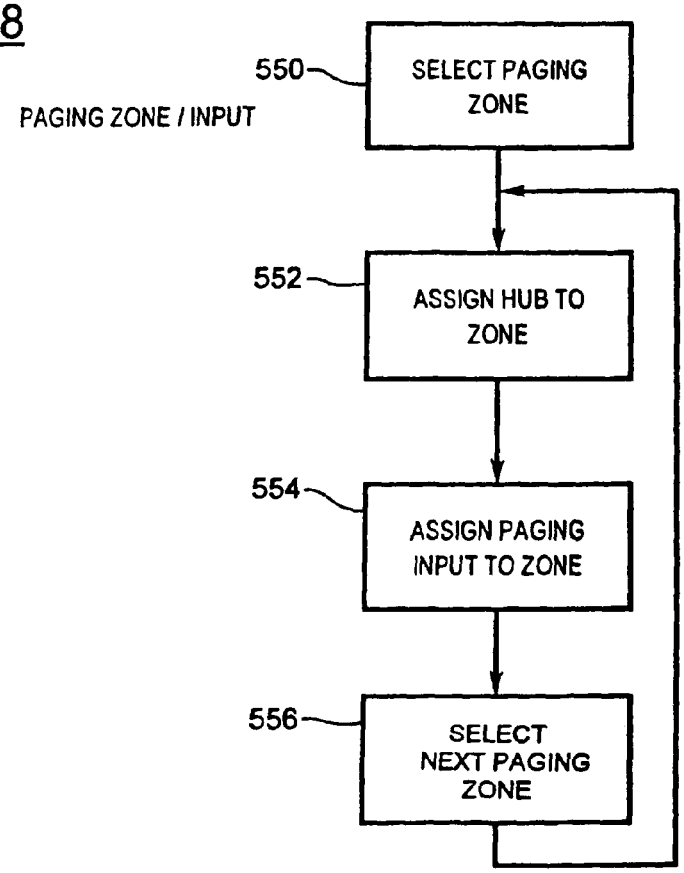
FIG. 19 shows in flowchart form the processing steps for a paging zone and input setting function for the control unit.
Figure 20:
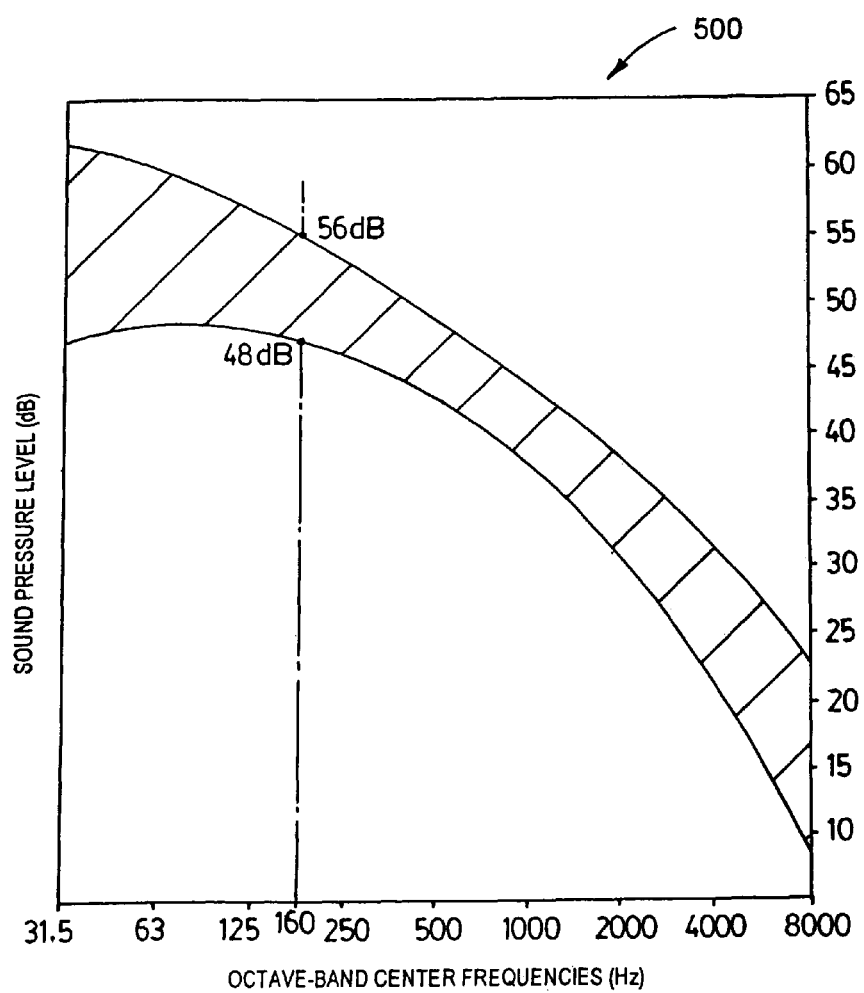
FIG. 20 shows in graphical form a Prescribed Spectrum Contour table for the sound masking signal.

Reference is next made to FIG. 19 the processing steps for the paging zone/input function 104 (FIG. 4) and the paging zone/input menu function 224 (FIG. 6) in the control unit 12. The first step indicated in block 550 involves selecting one of the paging zones configured for the installation. Next, one or more of the hubs 14, 16 or 18 is assigned to the selected paging zone as indicated in block 552. Next in step 554, one of the paging inputs 83 (FIG. 3) is assigned from one of the paging channels 154 (FIG. 3(*b*)) which has been assigned to the hub or group of hubs 14, 16, 18. The selected paging input is played over the associated speakers 22 for the hubs 14, 16, 18 (and 20) which belong to the paging zone. It will be appreciated that in certain instances, for example in an emergency situation, the paging zone for a paging signal will include all the hubs 14, 16, 18 irrespective of the paging zones. Next, the control unit 12 in step 556 selects the next paging zone and repeats the steps described above.

Figure 23A:
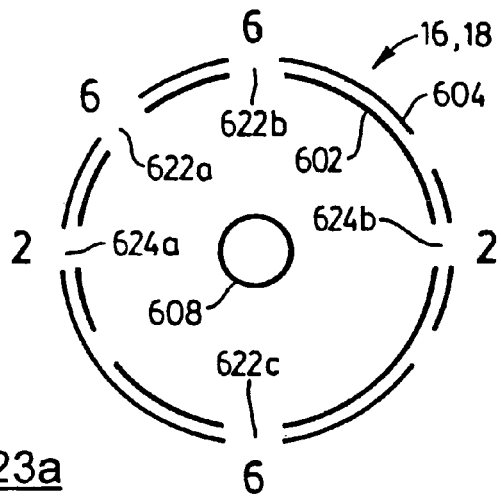
FIGS. 23(a) to 23(c) show in diagrammatic form different configurations for the housing of FIG. 22.
Figure 23B:
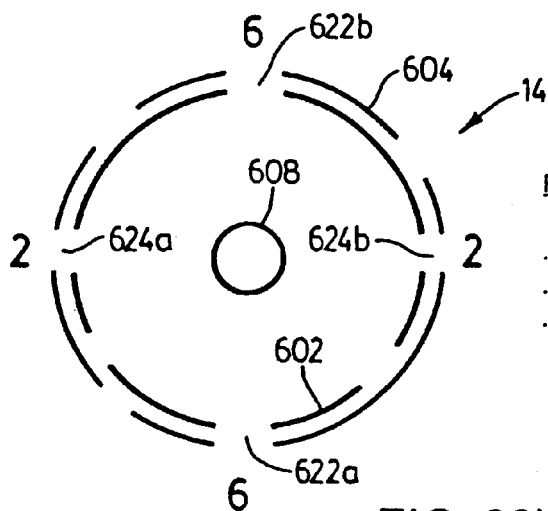
Figure 23C:
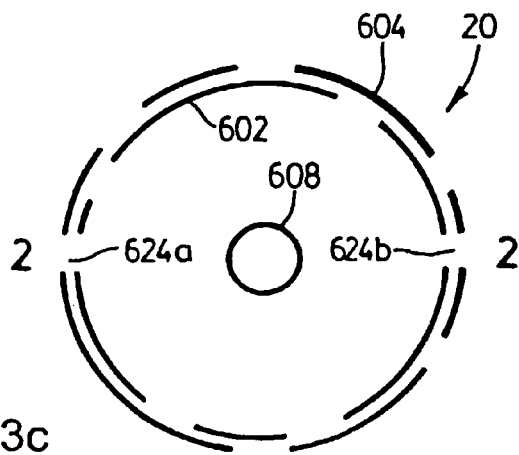

Reference is next made to FIGS. 22 and 23 which show an adaptable housing arrangement 600 for the master sound masking or hub units and the satellite units according to another aspect of the present invention. The housing 600 comprises an arrangement which is configurable for each type of master sound masking unit or hub: the master hub 14; the master switch hub 16; the master power hub 18; and also for the satellite hub 20. As shown, the housing 600 comprises an inner housing component 602, an outer housing component 604, and a circuit board 606. The circuit board 606 has a centered hole 608 which fits over a center post 610 in the inner housing component 602. The circuit board 606 is mounted in the inner housing component 602 using screw mounts 612. The outer housing 604 fits over the inner housing 602 to enclose the circuit board 606. The outer housing 606 is secured to the inner housing 602 using screw mounts 618 which correspond to screw holes 620 in the outer housing 604.

As shown in FIG. 22, the inner housing 602 includes openings 622, indicating individually by reference 622a, 622b, 622c, for accommodating larger, e.g. 6-pin, electrical connectors 626, and openings 624, indicated individually by references 624a, 624b, for accommodating smaller, e.g. 2-pin, electrical connectors 628. The outer housing 604 includes corresponding openings 623 for accommodating the larger electrical connectors 626, and openings 625 for accommodating the smaller electrical connectors 628. As also shown in FIG. 22, the circuit board 606 includes corresponding socket (i.e. female) connectors 627 for coupling to the 6-pin connectors 626, and socket connectors 629 for coupling to the 2-pin connectors 628. The connectors 626, 628 facilitate the electrical connection between the master hubs 14, 16, 18 to form the network 11 as described above with reference to FIG. 1. A connector 630 is also provided for connecting the speaker 22 to the circuit board 606.

The master sound masking switch hub 16 and the master sound masking power hub 18 require five connector openings comprising three openings 622 for 6-pin connectors 626 and two openings 624 for 2-pin connectors 628. As shown in FIG. 23(*a*), the inner housing 602 and the outer housing 604 are rotated and secured (e.g. with screw fasteners) in "position 1" to configure the openings 624 and 626. Although different circuit boards 606 are provided for the power hub circuitry and the switch hub circuitry, the circuit board 606 carries three 6-pin connector sockets 627 (FIG. 22) and two 2-pin connector sockets 629 (FIG. 22). The openings which are not used are covered by the wall or skirt of the outer housing 604.

The master sound masking hub 14 requires four connector openings comprising two 6-pin connector openings 622 and two 2-pin connector openings 624. As shown in FIG. 23(*b*), the inner housing 602 and the outer housing 604 are rotated into "position 2" to align two 6-pin connector openings 622a and 622b and two 2-pin connector openings 624a, 624b. The circuit board 606 for the master hub 14 is configured with two 6-pin connector sockets 627 (FIG. 22) and two 2-pin connector sockets 629 (FIG. 22) which register with the corresponding openings 622a, 622b and 624a, 624b in the inner housing 602.

The satellite sound masking hub 20 requires two connector openings comprising two 2-pin connector openings 624. As shown in FIG. 23(*c*), the inner housing 602 and the outer housing 604 are rotated into "position 3" to align two 2-pin connector openings 624a, 624b. The circuit board 606 for the satellite hub 14 is configured with two 2-pin connector sockets 629 (FIG. 22) which register with the corresponding openings 624a, 624b in the inner housing 602.

Advantageously, such an arrangement facilitates manufacturing, inventory management and installation.

Suitable connectors 626,627 and 628,629 include the Micro-Fit™ from Molex: dual row vertical—part no. 43045-0212; dual row right angle—part no. 43045-0200; dual row right angle—part no. 43045-0600.

The present invention may be embodied in other specific forms without departing from the spirit or essential characteristics thereof. Certain adaptations and modifications of the invention will be obvious to those skilled in the art. Therefore, the presently discussed embodiments are considered to be illustrative and not restrictive, the scope of the invention being indicated by the appended claims rather than the foregoing description, and all changes which come within the meaning and range of equivalency of the claims are therefore intended to be embraced therein.

What is claimed is:

1. A sound masking system for masking sound in a physical environment, said sound masking system comprising:
   a communication network for said physical environment;
   a plurality of sound masking units, at least some of said sound masking units including a digital processor configured for a sound masking signal generator and a communication interface for coupling to said communication network for receiving a plurality of control signals over said communication network, one of said control signals being a masking volume signal and a another, separate one of the control signals being a masking frequency signal, and said sound masking signal generator being responsive to said masking volume signal and said sound masking frequency signal for generating a sound masking output signal, said sound masking output signal having a volume derived from said masking volume signal, and said sound masking output signal having a frequency characteristic derived from said sound masking frequency signal;
   a control unit configured to generate said control signals, said control unit configured to generate said masking volume signal and said control unit configured to separately generate said masking frequency signal, and said control unit having a communication interface for coupling to said communication network for transmitting said control signals to selectively control operations of said plurality of sound masking units.

2. The sound masking system as claimed in claim 1, wherein said sound masking unit includes an address component for recognizing control signals intended for the sound masking unit associated with said address component.

3. The sound masking system as claimed in claim 1, wherein said plurality of sound masking units are associated with a plurality of sound masking zones, each of said sound masking units being associated with one of said plurality of sound masking zones, and said sound masking units providing sound masking for said associated sound masking zone independently of said other sound masking zones.

4. The sound masking system as claimed in claim 3, wherein said sound masking units associated with each of said sound masking zones are configured to provide a sound masking output tailored for said associated sound masking zone and said sound masking output being based on said masking volume and said masking frequency signals.

5. The sound masking system as claimed in claim 1, further comprising a plurality of zones, and one or more of said sound masking units being configured for one or more of said zones.

6. The sound masking system as claimed in claim 5, wherein said zones includes one or more of a sound masking zone, a timer zone, and a switch zone.

7. A sound masking system for controlling the ambient noise in a physical environment, said sound masking system comprising:
- a communication network for said physical environment;
- a plurality of sound masking units, at least some of said sound masking units including a sound masking generator comprising a processor configured to generate a sound masking signal and a communication interface for coupling to said communication network for receiving control signals over said communication network, one of said control signals being a masking volume signal and another, separate one of said control signals being a masking frequency signal, and said sound masking generator being responsive to said masking volume signal and said masking frequency signal for generating said sound masking signal;
- a control unit configured to generate said control signals, said control unit configured to generate said masking volume signal and said control unit configured to separately generate said masking frequency signal, and said control unit having a communication interface for coupling to said communication network for transmitting said one or more control signals to selectively control operations of said plurality of sound masking units;
- a plurality of zones, and one or more of said sound masking units being configured for one or more of said plurality of zones.

8. The sound masking system as claimed in claim 7, wherein said zones include one or more of a sound masking zone, a non-masking zone, a timer zone, and a switch zone.

* * * * *